US 6,674,141 B1

(12) United States Patent
Kubena et al.

(10) Patent No.: US 6,674,141 B1
(45) Date of Patent: Jan. 6, 2004

(54) SINGLE CRYSTAL, TUNNELING AND CAPACITIVE, THREE-AXES SENSOR USING EUTECTIC BONDING AND A METHOD OF MAKING SAME

(75) Inventors: Randall L. Kubena, Oak Park, CA (US); David T. Chang, Covina, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/629,683

(22) Filed: Aug. 1, 2000

(51) Int. Cl.$^7$ ............................ H01L 29/82; H01L 23/58
(52) U.S. Cl. ...................... 257/417; 257/587; 250/234; 216/11
(58) Field of Search ............................ 250/234; 216/11, 216/2; 438/12; 257/414, 415, 417, 587

(56) References Cited

U.S. PATENT DOCUMENTS

| 5,015,850 A | 5/1991 | Zdeblick et al. ............ 250/306 |
| 5,210,714 A | 5/1993 | Pohl et al. .................. 365/157 |
| 5,226,321 A | 7/1993 | Varnham et al. |

(List continued on next page.)

FOREIGN PATENT DOCUMENTS

| DE | 43 05 033 A1 | 10/1993 |
| EP | 0 619 495 A | 10/1994 |
| JP | 04-369418 | 12/1992 |
| JP | 08-203417 | 8/1996 |
| WO | 97/10698 | 3/1997 |

OTHER PUBLICATIONS

Gretillat et al., "Improved Design of a Silicon Micromachined Gyroscope with Piezoresistive Detection and Electromagnetic Excitation", IEEE Journal of Microelectromechanical Systems, vol. 8, No. 3, Sep. 1999, pp 243–250.*

Grade, John, et al., "Wafer–Scale Processing, Assembly, and Testing and Tunneling Infrared Detectors", Transducers '97, 1997 International Conference on Solid State Sensors and Actuators, Chicago, Jun. 16–19, pp. 1241–1244.

(List continued on next page.)

Primary Examiner—William David Coleman
(74) Attorney, Agent, or Firm—Ladas & Parry

(57) ABSTRACT

A three axis MEM tunneling/capacitive sensor and method of making same. Cantilevered beam structures for at least two orthogonally arranged sensors and associated mating structures are defined on a first substrate or wafer, the at least two orthogonally arranged sensors having orthogonal directions of sensor sensitivity. A resonator structure of at least a third sensor is also defined, the third sensor being sensitive in a third direction orthogonal to the orthogonal directions of sensor sensitivity of the two orthogonally arranged sensors and the resonator structure having a mating structure thereon. Contact structures for at least two orthogonally arranged sensors are formed together with mating structures on a second substrate or wafer, the mating structures on the second substrate or wafer being of a complementary shape to the mating structures on the first substrate or wafer. The mating structures of the first substrate are disposed in a confronting relationship with the mating structures of the second substrate or wafer. A eutectic bonding layer associated with one of the mating structures facilitates bonding between the respective mating structures. At least a portion of the first substrate or wafer is removed to release the cantilevered beam structures and the resonator structure.

88 Claims, 15 Drawing Sheets

U.S. PATENT DOCUMENTS

| | | | | |
|---|---|---|---|---|
| 5,265,470 | A | | 11/1993 | Kaiser et al. ............... 73/178 R |
| 5,313,835 | A | | 5/1994 | Dunn ........................... 73/505 |
| 5,354,985 | A | | 10/1994 | Quate ......................... 250/234 |
| 5,475,318 | A | | 12/1995 | Marcus et al. ............... 324/762 |
| 5,659,195 | A | | 8/1997 | Kaiser et al. ................ 257/415 |
| 5,665,253 | A | | 9/1997 | Kubena et al. ................ 216/41 |
| 5,666,190 | A | * | 9/1997 | Quate et al. ................. 250/234 |
| 5,747,804 | A | | 5/1998 | Williams et al. |
| 5,883,387 | A | | 3/1999 | Matsuyama et al. ......... 250/306 |
| 5,894,090 | A | | 4/1999 | Tang et al. .............. 73/504.02 |
| 5,929,497 | A | | 7/1999 | Chavan et al. .............. 257/417 |
| 5,994,750 | A | | 11/1999 | Yagi ............................ 257/415 |
| 6,075,585 | A | | 6/2000 | Minne et al. .................. 355/71 |
| 6,091,125 | A | | 7/2000 | Zavracky ..................... 257/417 |
| 6,092,423 | A | | 7/2000 | Beardmore ................... 73/704 |
| 6,174,820 | B1 | * | 1/2001 | Habermehl et al. ........... 216/11 |
| 6,211,532 | B1 | | 4/2001 | Yagi ............................. 257/40 |
| 6,229,190 | B1 | | 5/2001 | Bryzek et al. ............... 257/419 |
| 6,296,779 | B1 | * | 10/2001 | Clark et al. ..................... 216/2 |
| 6,337,027 | B1 | * | 1/2002 | Humphrey ..................... 216/2 |

OTHER PUBLICATIONS

Kenny, T.W., et al., "Micromachined Silicon Tunnel Sensor for Motion Detection", Appl. Phys. Lett., vol. 58, No. 1, Jan. 7, 1991, pp. 100–102.

Yeh, et al., "A Low Voltage Bulk–Silicon Tunneling–Based Microaccelerometer", IEEE, 1995 pp. 23.1.1–23.1.4.

Cheng, Y.T. and Khalil Najafi, "Localized Silicon Fusion and Eutectic Bonding for MEMS Fabrication and Packaging," *Journal of Microelectromechanical Systems*, vol. 9, No. 1, pp. 3–8 (Mar. 2000).

Abstract of JP 04–369418, *Patent Abstracts of Japan*, vol. 017, No. 250, May 18, 1993.

Abstract of JP 08–203417, *Patent Abstracts of Japan*, vol. 1996, No. 12, Dec. 26, 1996.

Kubena, R.L., et al., "A New Miniaturized Surface Micromachined Tunneling Accelerometer," *IEEE Electron Device Letters*, vol. 17, No. 6, pp. 306–308 (Jun. 1996).

Kubena, R.L., et al., "New miniaturized tunneling–based gyro for inetrial measurement applications," 43rd *Journal of Vacuum Science & Technology B (Microelectronics and Nanometer Structures*, vol. 17, No. 6, pp. 2948–2952 (Nov./Dec. 1999).

Liu, C–H, et al., "Characterization of a High–Sensitivity Micromachined Tunneling Accelerometer with Micro–g Resolution," *Journal of Microelectromechanical Systems*, vol. 7, No. 2, pp. 235–243 (Jun. 1998).

Motamedi, M.E., et al., "Tunneling Tip Engine for Microsensors Applications," *Materials and Device Characterization in Micromachining II—Proceedings of the SPIE*, Santa Clara, California, vol. 3875, pp. 192–199 (Sep. 1999).

* cited by examiner

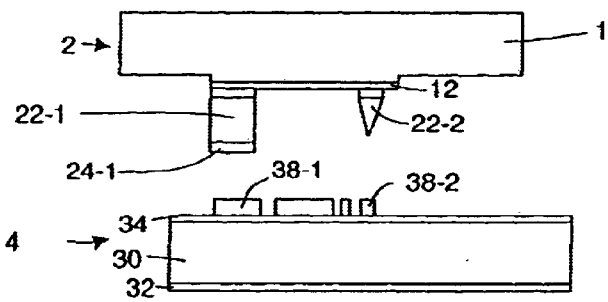
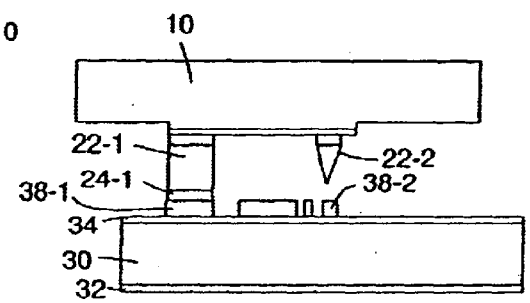
Figure 10        Figure 11
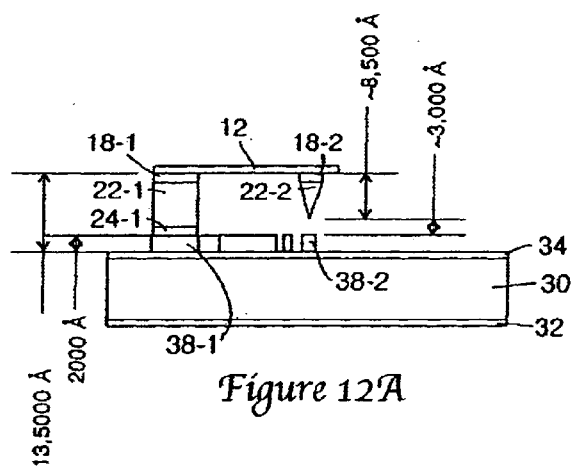
Figure 12A
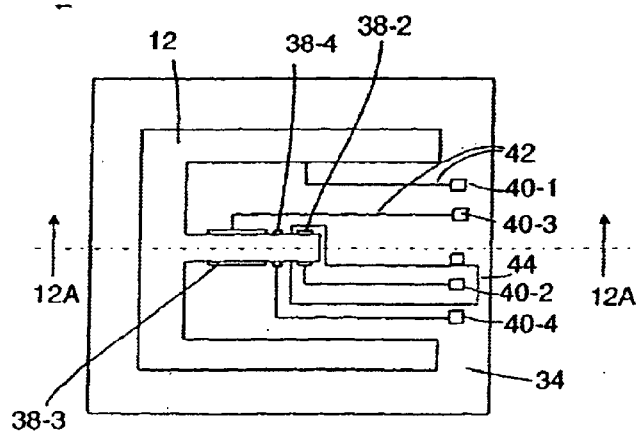
Figure 12B

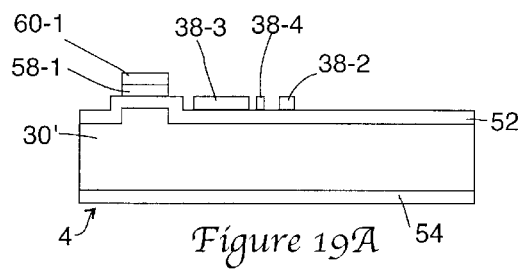
Figure 19A
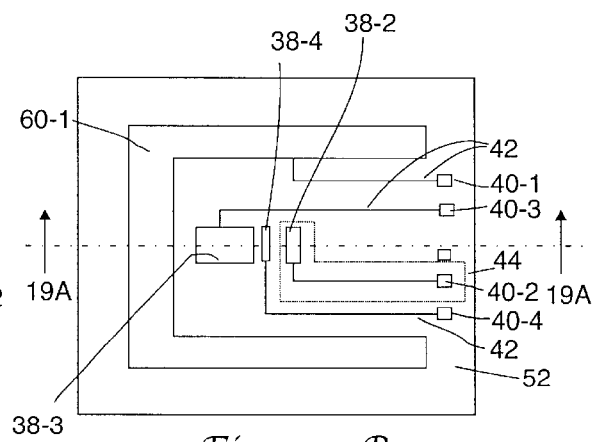
Figure 19B
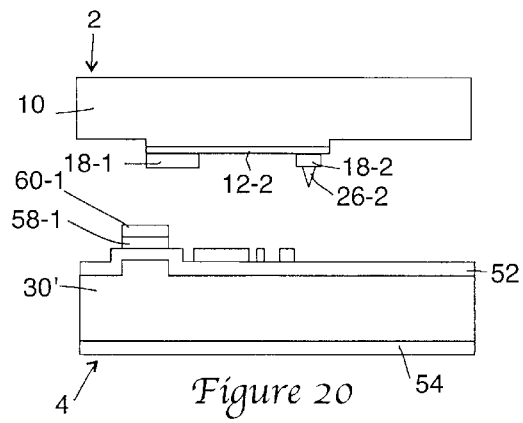
Figure 20
Figure 21
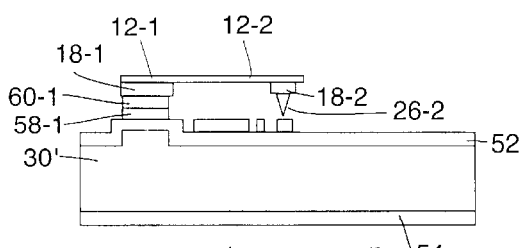
Figure 22A
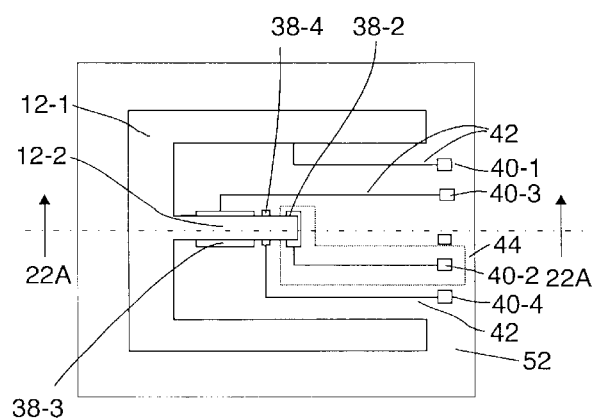
Figure 22B

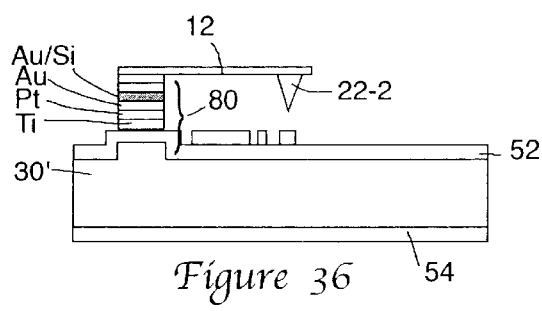
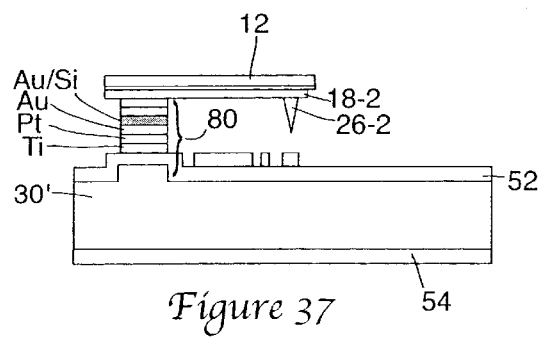
Figure 36
Figure 37

TOP VIEW

SIDE VIEW

US 6,674,141 B1

SINGLE CRYSTAL, TUNNELING AND CAPACITIVE, THREE-AXES SENSOR USING EUTECTIC BONDING AND A METHOD OF MAKING SAME

RELATED APPLICATIONS

This invention is related to other inventions which are the subject of separate patent applications filed thereon. See: U.S. patent application Ser. No. 09/629,682 issued as U.S. Pat. No. 6,580,138 on Jun. 17, 2003 entitled "A Single Crystal, Dual Wafer, Tunneling Sensor or Switch with Silicon on Insulator Substrate and a Method of Making Same"; U.S. patent application Ser. No. 09/629,684 entitled "A Single Crystal, Dual Wafer, Tunneling Sensor and a Method of Making Same"; U.S. patent application Ser. No. 09/629,679 issued as U.S. Pat. No. 6,555,404 on Apr. 29, 2003 entitled "A Single Crystal, Dual Wafer, Gyroscope and a Method of Making Same"; U.S. patent application Ser. No. 09/629,680 issued as U.S. Pat. No. 6,563,184 on May 13, 2003 entitled "A Single Crystal, Dual Wafer, Tunneling Sensor or Switch with Substrate Protrusion and a Method of Making Same", all of which applications have the same filing date as this application, and all of which applications are hereby incorporated herein by reference.

TECHNICAL FIELD

The present invention relates to micro electro-mechanical (MEM) tunneling/capacitive sensors and in particularly to three axis sensors using multiple wafers which are bonded together eutectically.

BACKGROUND OF THE INVENTION

The present invention provides a new process of fabricating multiple-axes rotation rate sensors on a single substrate using high performance single crystal silicon tunneling and capacitive devices. The prior art has demonstrated the ability to integrate multi-axes capacitive sensors on a single silicon (Si) substrate for 3-axes rotation measurements. See "Micromachined Dual Input Axis Angular Rate Sensor," Thor Juneau, A. P. Pisano Solid-State Sensors and Actuator Workshop, Hilton Head, S.C., June 2–6, 1996, and "Microstructure Design of Angle Measuring MEMS Gyroscopes," Andrei M. Shkel, Ph. D. Thesis, Berkeley Sensor & Activator Center, 1999.) However, none of this prior art has addressed the combination of tunneling and capacitive sensors for a single-chip 3-axes sensor. The use of bulk-micromachining techniques and the techniques described in the above referenced patent applications allows for the combination of 2-axis tunneling rate gyros (for X & Y detection) and various types of 2-axis capacitive rate gyros on a single substrate.

One of the problems with prior art designs is that if three sensors are used, they need to be mechanically aligned. There is a need for a three axis sensor design in which the sensors are automatically aligned relative to each other as a result of the manufacturing process employed. This invention addresses this need.

BRIEF DESCRIPTION OF THE INVENTION

Generally speaking, the present invention provides a method of making a micro electro-mechanical three-axis sensor wherein two orthogonally positioned cantilevered beam structures and a mating structure are defined on a first substrate or wafer and at least one contact structure and a mating structure are defined on a second substrate or wafer. The mating structure on the second substrate or wafer is of a complementary shape to the mating structure on the first substrate or wafer. A bonding or eutectic layer is provided on at least one of the mating structures and the mating structure are moved into a confronting relationship with each other. Pressure is then applied between the two substrates and heat may also be applied so as to cause a bond to occur between the two mating structures at the bonding or eutectic layer. Then the first substrate or wafer is removed to free the cantilevered beam structures for movement relative to the second substrate or wafer. The bonding or eutectic layer also provides a convenient electrical path to the cantilevered beam for making a circuit with the contact formed on the cantilevered beam.

In another aspect the present invention provides an assembly or assemblies for making a single crystal silicon three axis MEM sensor therefrom. A first substrate or wafer is provided upon which is defined at least two cantilevered beam structures and a mating structure. A second substrate or wafer is provided upon which is defined at least two contact structures and a mating structure, the mating structure on the second substrate or wafer being of a complementary shape to the mating structure on the first substrate or wafer. The two cantilevered beams are orthogonally to each other. Another sensor which is sensitive in a third orthogonal direction is also provided. A pressure sensitive bonding layer is disposed on at least one of the mating structures for bonding the mating structure defined on the first substrate or wafer with the mating structure on the second substrate in response to the application of pressure and heat therebetween.

The three axis sensor of the present invention provides for automatic self-alignment of the three sensors relative to each order in that semiconductor manufacturing type processes are used to manufacture the three sensors and thus the three sensors are lithographically aligned due to the use of masks to create most of the structures of the three sensors.

BRIEF DESCRIPTION OF THE FIGURES

FIGS. 1A through 6A depict the fabrication of a first embodiment of the cantilever portion of a MEM sensor.

FIGS. 1B through 6B correspond to FIGS. 1A–6A, but show the cantilever portion, during its various stages of fabrication, in plan view:

FIGS. 7A through 9A show, in cross section view, the fabrication of the base portion of the first embodiment tunneling sensor;

FIGS. 7B through 9B correspond to FIGS. 7A–9A but show the fabrication process for the base portion in plan view;

FIGS. 10 and 11 show the cantilever portion and the base portion being aligned with each other and being bonded together by eutectic bonding;

FIGS. 12A and 12B show in a cross sectional view and in a plan view the completed tunneling sensor according to the first embodiment of the invention:

FIGS. 15A–19A depict, in cross section view, the fabrication of the base portion of the second embodiment of the tunneling sensor;

FIGS. 15B–19B correspond to FIGS. 15A–19A, but show the fabrication process for the second embodiment of the wafer in plan view;

FIGS. 20 and 21 show the cantilever and base portion embodiment being aligned with each other and bonded together by eutectic bonding;

FIGS. 22A and 23 show the completed MEM sensor according to the second embodiment in cross sectional view, while FIG. 22B shows the completed MEM sensor according to the second embodiment in plan view;

FIGS. 24A through 29A depict, in cross sectional view, a modification applicable to both the first and second embodiments of the cantilever portion of the MEM sensor;

FIGS. 24B through 29B correspond to FIGS. 24A–29A, but show the fabrication process for the modification in plan view;

FIG. 36 depicts a side elevational section view of another embodiment of a MEM sensor, this embodiment having an eutectic bond in a central region of its columnar support as in the embodiment of FIG. 30, but also utilizing a base structure having a silicon protrusion which forms part of the columnar support structure;

FIG. 37 depicts a side elevational section view of another embodiment of a MEM sensor, this embodiment having an eutectic bond in a central region of its columnar support and a base structure having a silicon protrusion which forms part of the columnar support structure as in the embodiment of FIG. 36, but also utilizing a ribbon conductor on the cantilevered beam structure.

DETAILED DESCRIPTION

Several techniques for forming cantilevered beams in MEM sensor assemblies are first described with respect to the aforementioned FIGS. 1–37. Other techniques for forming cantilevered beam structures can be found in the patent applications which are incorporated herein by reference. The three axis MEM sensor which is the subject of this application is described with reference to FIGS. 38–40B.

The MEM sensors shown in the accompanying figures are not drawn to scale, but rather are drawn to show the relevant structures for those skilled in this art. Those skilled in this art realize that these devices, while mechanical in nature, are very small and are typically manufactured using generally the same type of technology used to produce semiconductor devices. To gain an appreciation of the small scale of these devices, the reader may wish to turn to FIG. 23 which includes size information for the preferred embodiment of a MEM sensor utilizing the present invention.

Figure 1A:
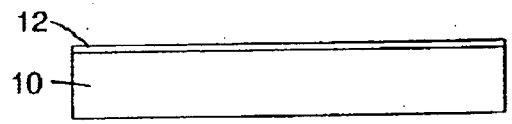
Figure 1B:
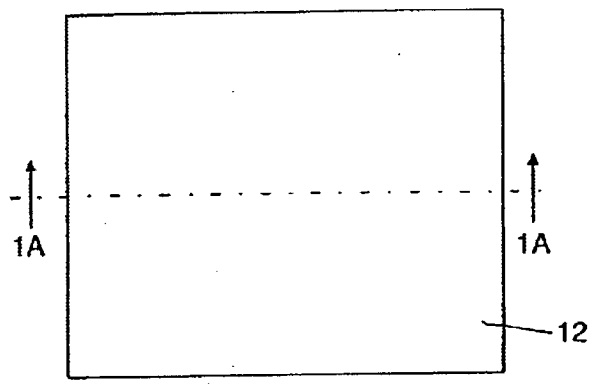

Turning to FIGS. 1A and 1B, a starting wafer for the fabrication of the cantilever is depicted. The starting wafer includes a wafer of bulk n-type silicon 10 upon which is formed a thin layer of doped p-type silicon 12. The silicon wafer 10 is preferably of a single crystalline structure having a <100> crystalline orientation. The p-type silicon layer 12 may be grown as an epitaxial layer on silicon wafer 10. The layer 12 preferably has a thickness of in the range of 1 to 20 micrometers ($\mu$m), but can have a thickness anywhere in the range of 0.1 $\mu$m to 800 $\mu$m. Generally speaking, the longer the cantilevered beam is the thicker the beam is. Since layer 12 will eventually form the cantilevered beam, the thickness of layer 12 is selected to suit the length of the beam top be formed.

Layer 12 is p-type doped preferably with Boron to reduce its resistivity to less than 0.05 $\Omega$-cm and preferably doped in the range of 0.01 to 0.05 $\Omega$-cm. The resistivity of the bulk silicon wafer or substrate 10 is preferably about 10 $\Omega$-cm. Boron is a relatively small atom compared to silicon, and therefore including it as a dopant at the levels needed ($10^{20}$) in order to reduce the resistivity of the layer 12 intends to induce stress which is preferably compensated for by also doping, at a similar concentration level, a non-impurity atom having a larger atom size, such as germanium. Germanium is considered a non-impulity since it contributes no electron carriers to the resulting material.

Layer 12 shown in FIGS. 1A and 1B is patterned using well known photolithographic techniques to form a mask layer, patterned as shown at numeral 14, preferably to assume the shape of a capital letter 'E'. While the shape of the capital letter 'E' is preferred, other shapes can be used. In this embodiment, the outer peripheral portion of the E-shape will form a mating structure which will be used to join the cantilever portion of the sensor to the base portion.

Figure 2A:
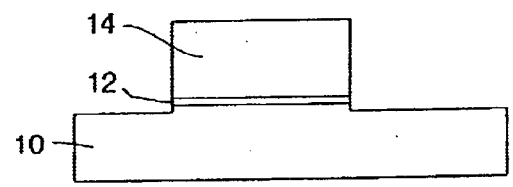
Figure 2B:
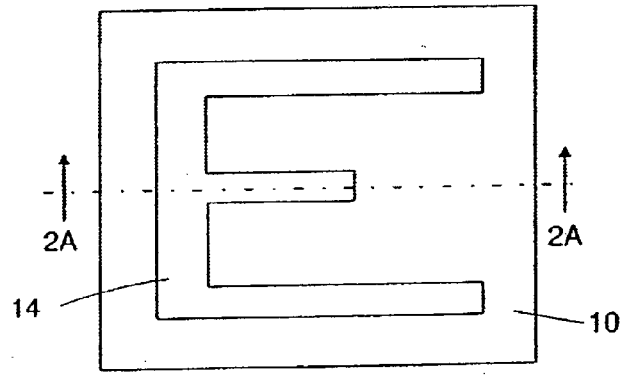

After the mask layer 14 has been patterned as shown in FIGS. 2A and 2B, the wafer is subjected to a plasma etch in order to etch through the thin layer of p-type doped silicon 12 and also to over etch into the silicon wafer 10 by a distance of approximately 500 Å.

Figure 3A:
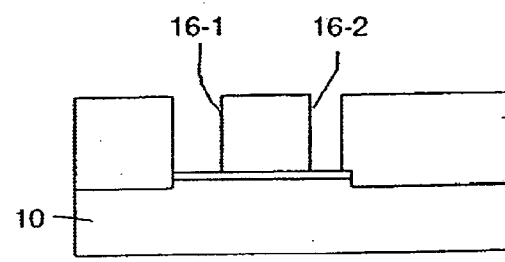
Figure 3B:
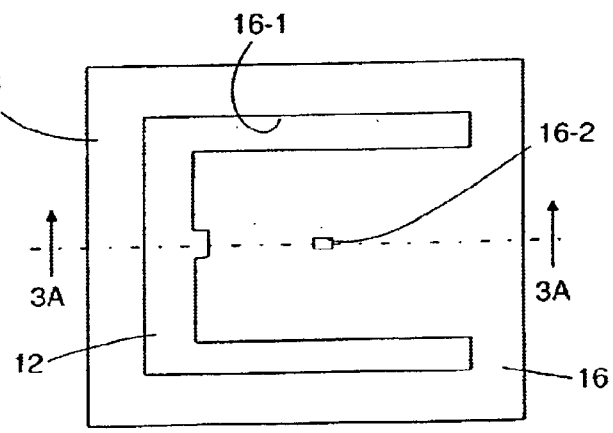

The mask 14 shown in FIGS. 2A and 2B is then removed and another photoresist layer 16 is applied which is patterned as shown in FIGS. 3A and 3B by providing two openings therein 16-1 and 16-2. Opening 16-1 basically follows the outer perimeter of the 'E' shape of the underlying thin layer of p-type silicon 12 while opening 16-2 is disposed at or adjacent a tip of the interior leg of the 'E'-shaped p-type silicon layer 12.

Layers of Ti/Pt/Au are next deposited over mask 16 and through openings 16-1 and 16-2 to form a post contact 18-1 and a tunnelling tip contact 18-2. The Ti/Pt/Au layers preferably have a total thickness of about 2000 Å. The individual layers of Ti and Pt may have thicknesses in the ranges of 100–200 Å and 1000–2000 Å, respectively. After removal of the photoresist 16, the wafer is subjected to a sintering step at approximately 520° C. to form an ohmic Ti—Si juncture between contacts 18-1 and 18-2 and the underlying layer 12. As will be seen with reference to FIGS. 24A–28B, the sintering step can be eliminated if a metal layer is used to connect contacts 18-1 and 18-2.

Figure 4A:
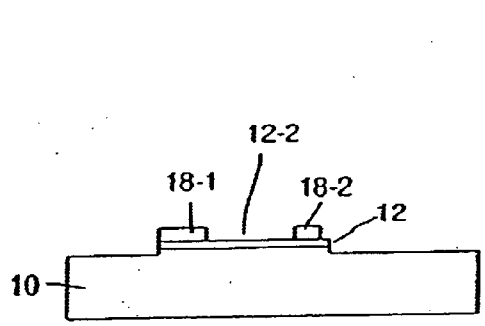
Figure 4B:
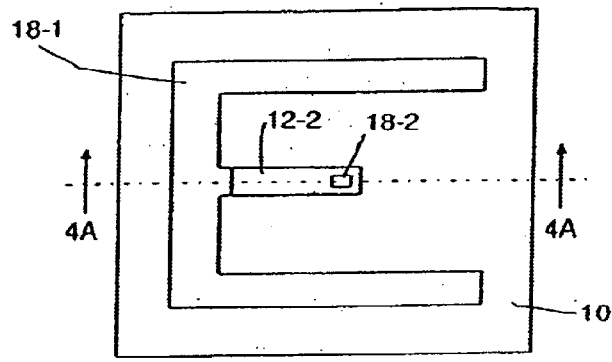
Figure 5A:
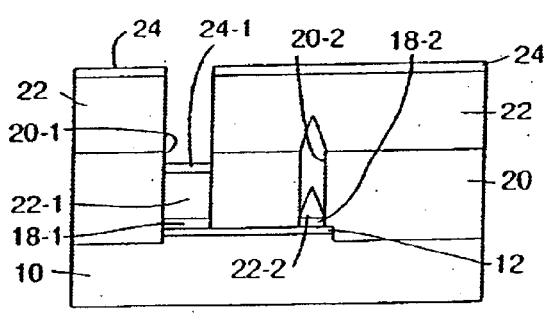
Figure 5B:
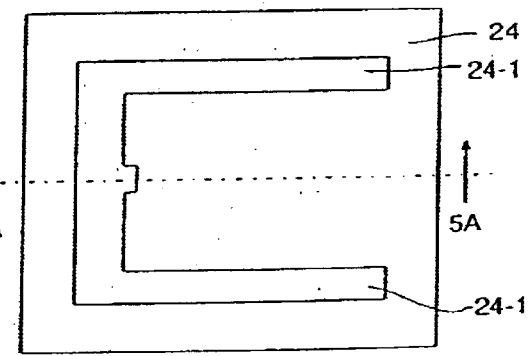

The structures shown in FIGS. 4A and 4B are then covered with a layer of photoresist 20 which is patterned so that is assumes the same shape as did photoresist layer 16 previously discussed with reference to FIGS. 3A and 3B. Thus, photoresist layer 20 has an opening 20-1 and another opening 20-2 therein. Those skilled in the art will appreciate that the size of the openings 16-1, 16-2, 20-1 and 20-2 are not drawn to scale on the figures and that openings 16-2 and 20-2 would tend to be significantly smaller than would be openings 16-1 and 20-1. As such, when a rather thick layer of Ti/Pt/Au is deposited on the wafer, it basically fills opening 20-1 (see FIG. 5A); however, those skilled in the art will appreciate that there is some fill-in at the sides of a mask when a layer such as layer 22 is deposited because of an increasing overhang which occurs at the edges of openings 20-1 and 20-2 as the deposition process proceeds. Since the width of the opening 20-1 is quite wide, the effect of the fill-in is not particularly important. However, since opening 20-2 is rather narrow to begin with, the deposited Ti/Pt/Au 22, as shown at numeral 20-2, assumes a pyramidal-like or conical-like shape. The thickness of the deposition of Ti/Pt/Au layer 22 is sufficiently thick to assure that layer 22 will close across the top of opening 20-2 during the deposition process. Finally, a relatively thin layer, preferably about 100 Å thick, of Au/Si 24 is deposited on the structure and through opening 20-1 as depicted by numeral 24-1.

Figure 6A:
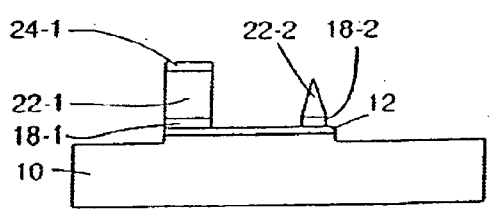
Figure 6B:
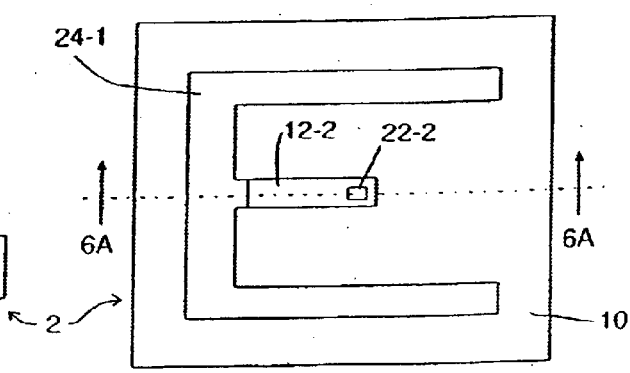

The photoresist 20 is then dissolved lifting of the layers 22 and 24 formed thereon and leaving the structure depicted by FIGS. 6A and 6B. The height of layers 22-1 and 24-1 above layer 12 is preferably on the order of 11,500 Å while the height of the pyramidal-like or conical structure 22-2 is preferable on the order of 8,500 Å. The cantilevered beam portion of the MEMS sensor of this first embodiment has now been formed, and thus we will now move onto the formation of the base structure for this first embodiment of the MEM sensor. As will be seen, layers 22-1 and 24-1 form a mating structure for mating the cantilevered beam portion with its base portion.

Figure 7A:
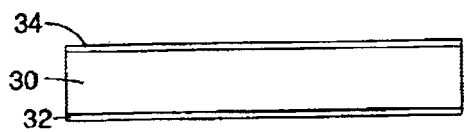
Figure 7B:
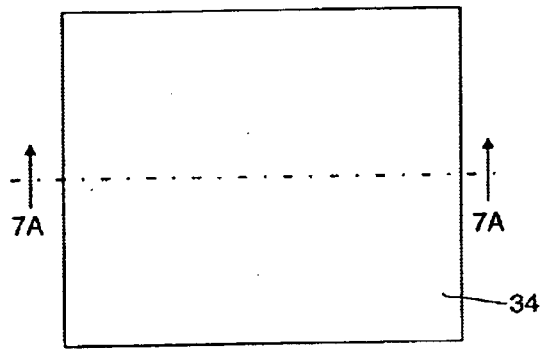
Figure 8A:
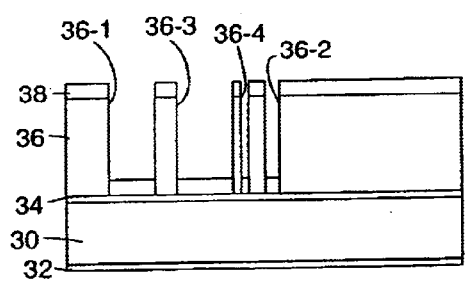
Figure 8B:
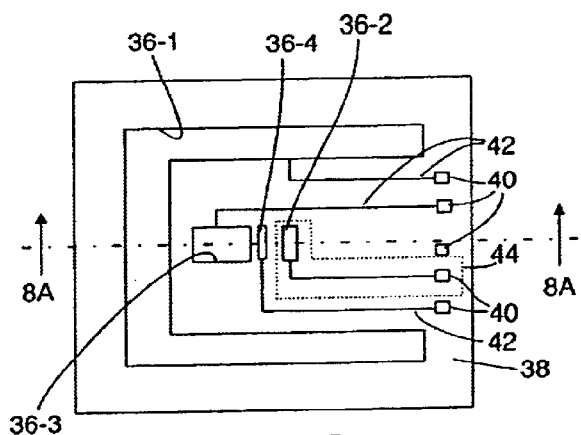

The fabrication of the base portion will now be described. Turning first to FIGS. 7A and 7B, there is shown a wafer 30 with layers of silicon dioxide 32 and 34 formed on its major surfaces. The thickness of each layer 32 and 34 is preferably on the order of 1.0 micrometers. Next, a mask is formed by a layer of photoresist 36 which is applied and patterned as shown in FIGS. 8A and 8B to form openings 36-1, 36-2, 36-3 and 36-4 therein. Opening 36-1 basically corresponds in shape and configuration to opening 16-1 discussed with reference to FIGS. 3A and 3B. Similarly, opening 36-2 basically corresponds to opening 16-2 discussed with reference to FIGS. 3A and 3B. Openings 36-3 and 36-4 allow for the deposition of control and self test electrodes 38-3 and 38-4. A layer of Ti/Pt/Au 38 is deposited on mask 36 and through the openings therein in order to form contact electrodes 38-1, 38-2, 38-3 and 38-4 on layer 34. Photoresist layer 36 also has openings in it so that when layer 38 is deposited, connection pads 40 are also formed for each one of the electrodes as well as interconnecting ribbon conductors 42. Preferably, a guard ring 44 is placed around tip electrode 36-2 and its associated ribbon conductor 42-2 and connection pad 40-2. The guard ring is not shown in the elevation views for ease of illustration.

Figure 9A:
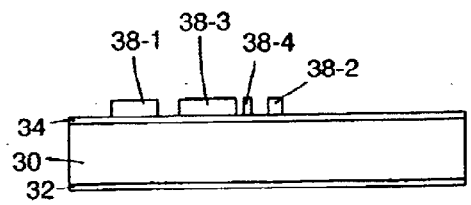
Figure 9B:
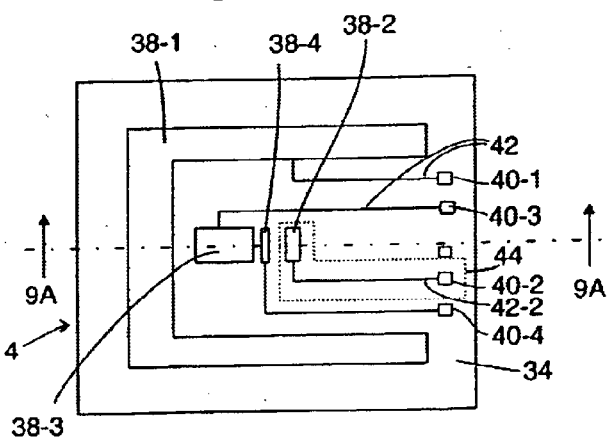

The photoresist layer 36 is then removed lifting off the layer 38 deposited thereon and leaving the structure shown in FIGS. 9A and 9B. Contact 38-1 assumes the shape of the outer periphery of a letter E and provides a mating structure for joining with the similar-shaped mating structure 22-1, 24-1 of the cantilevered beam portion 2.

Turning to FIG. 10, the cantilevered beam portion 2, preferably fabricated as described with reference to FIGS. 1A–6B, is mechanically aligned relative to the base portion 4 fabricated as described with reference to FIGS. 7A–9B. Of course, those skilled in the art will appreciate that the patterns shown on the surfaces of wafers 10 and 30 repeat many times over the surface of a wafer so that there are many cantilevered beam forming structures 2 comprising elements 22-1, 24-1, 12 and 22-2 and many corresponding base structures 4 comprising elements 38-1 through 38-4 which are manufactured for mating on the silicon wafers 10 and 30. The two wafers are brought into alignment (See FIG. 11) and subjected to pressure and heating so as to cause a eutectic bond to occur between layer 24-1 and layer 38-1. The pressure is developed preferably by applying a force of about 5,000 N at about 400° C. between three inch (7.5 cm) wafers 2,4 containing on the order of 1000 devices. Of course, the force needs to be adjusted depending on the size of the wafer and the total surface area to be bonded.

Layers 24-1 and 38-1 have preferably assumed the shape of the outerperpherial edge of a capital letter 'E' and therefore the moveable contact 22-2 of the MEM sensor is well protected by this physical shape. After performing the eutectic bonding, silicon layer 10 is dissolved away to arrive at the resulting MEM sensor shown in FIGS. 12A and 12B. The silicon can be dissolved with ethylenediamine pyrocatechol (EDP) which etches undoped silicon. Silicon doped with Boron as described herein resists this etchant. This etching step leaves only the Boron doped silicon cantilevered beam 12 with its contact 22-2 and its supporting or mating structure 22-1 and 24-1 bonded to the base structure 4. Preferable dimensions for the MEM sensor are given on FIG. 12A. The beam as preferably has a length of 200 to 300 μm (0.2 to 0.3 mm).

Instead of using EDP as the etchant, plasma etching can be used if a thin layer of $SiO_2$ is used, for example, as an etch stop between layer 12 and substrate 10.

A second embodiment of a MEM sensor will now be described. As in the case of the first embodiment, this discussion will begin with the fabrication of the cantilever beam portion 2, then go onto a discussion of the base portion 4 and the eutectic bonding and the completion of the MEM sensor. As will be seen, this second embodiment differs from the first embodiment by the manner in which the cantilevered beam supported above base portion 4.

Figure 13A:
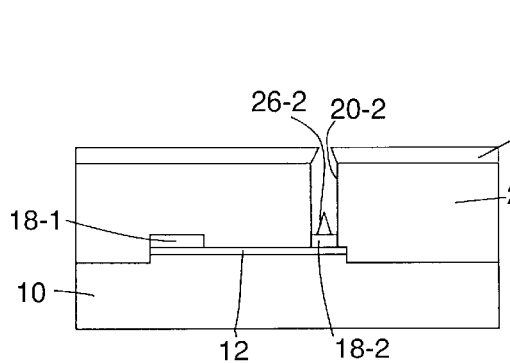
FIGS. 13A and 14A depict steps used in fabricating a second embodiment of a the cantilever portion of a MEM sensor.
Figure 13B:
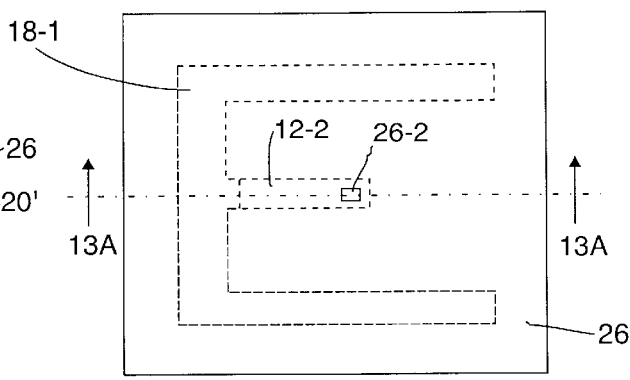
FIGS. 13B and 14B correspond to FIGS. 13A and 14A, but show the cantilever portion, in plan view.
Figure 14A:
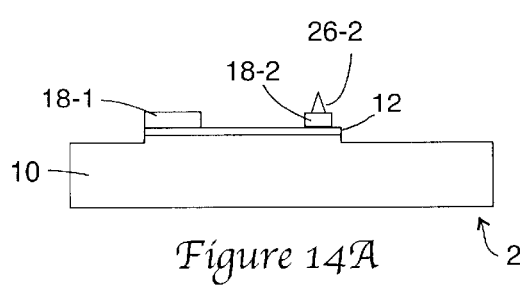
Figure 14B:
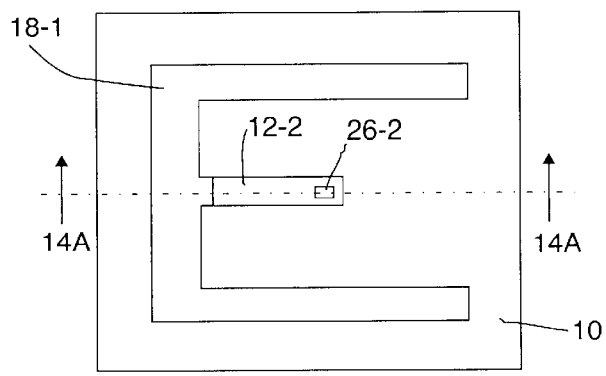

According to the second embodiment, the fabrication of the cantilever beam forming structure 2 starts as has been described with reference to FIGS. 1A through 4B of the first embodiment. Assuming that the fabrication steps discussed with reference to FIGS. 1A through 4B have been carried out, the structure depicted in FIGS. 4A and 4B will been obtained. From that point, a layer of photoresist 20' is put down and patterned to have a single opening 20-2 therein as shown in FIGS. 13A and 13B. A layer of gold 26, having a thickness of 15,000 Å, is applied over the photoresist 20' and the gold, as it deposits upon contact 18-2 through opening 20-2, will assume a pyramidal-like or conical-like shape so as to form a pointed contact 26-2 due to the formation of an overhang at the opening 20-2 during the deposition of the gold layer 26. After contact 26-2 is formed, the remaining photoresist 20' is dissolved so that the cantilever beam structure then appears as shown in FIGS. 14A and 14B. Comparing FIGS. 14A and 14B of the second embodiment with FIGS. 6A and 6B of the first embodiment, the primary difference between the two embodiments is the absence of layers 22-1 and 24-1 in the second embodiment, so that the mating structure is provided by layer 18-1 in this embodiment.

Figure 15A:
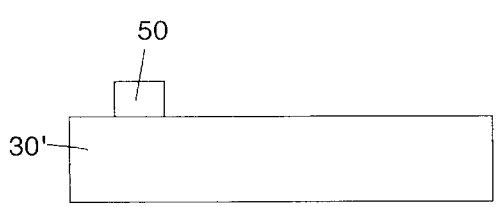
Figure 15B:
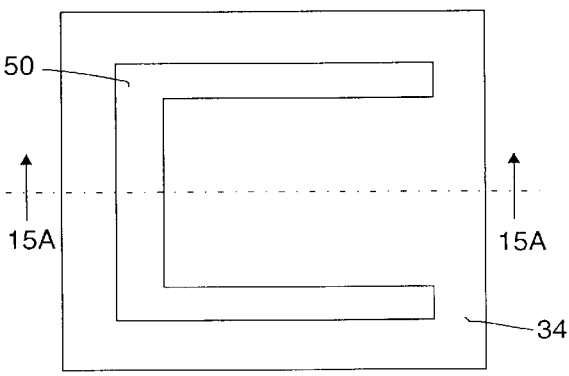
Figure 16A:
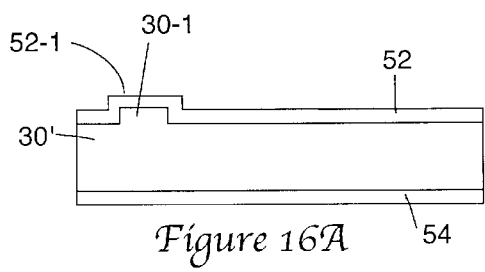
Figure 16B:
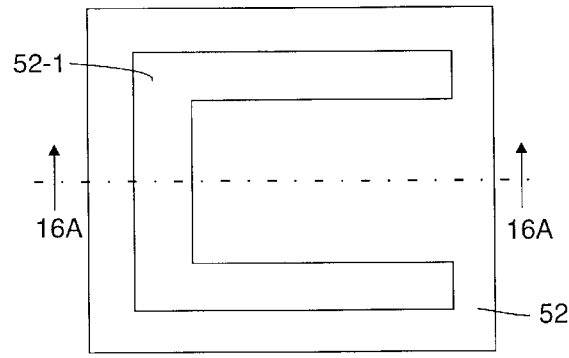

The fabrication of the base portion 4 of the second embodiment of the MEM sensor will now be described with reference to FIGS. 15A through 19B. Turning to FIGS. 15A and 15B, a wafer 30' of silicon is shown upon which a layer of photoresist 50 has been deposited and patterned to assume preferably the outerperipheral shape of a capital letter 'E'. The exposed silicon is then subjected to an etch, etching it back approximately 20,000 Å, to define a protruding portion 30-1 of wafer 30' under the patterned mask 50 of the photoresist. The photoresist mask 50 is then removed and wafer 30 is oxidized to form layers of oxide 52, 54 on its exposed surfaces. The oxide layers are each preferably about 1 $\mu$m thick. Layer 52 has a portion 52-1 which projects, preferably the outerperipheral shape of the capital letter 'E'. Of course, the end surfaces shown in FIG. 16A are not shown as being oxidized because it is assumed that the pattern shown in FIG. 16A is only one of a number of repeating patterns shown across an entire wafer 30'.

Figure 17A:
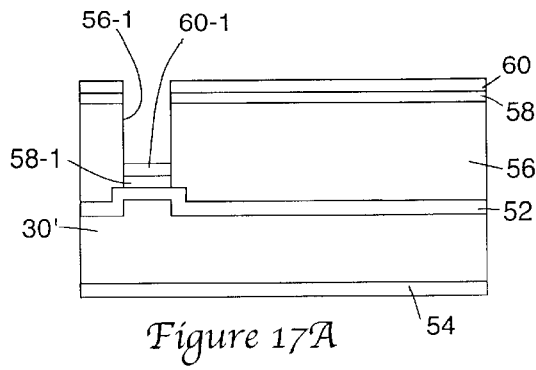
Figure 17B:
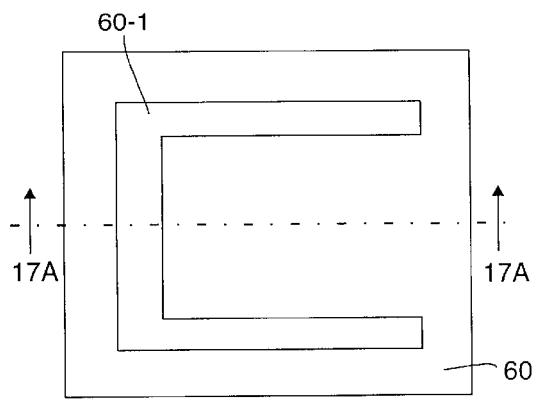

Turning to FIGS. 17A and 17BA, a layer of photoresist 56 is applied having an opening therein 56-1 which again assumes the outerperipheral shape of a capital letter 'E', as previously described. Then, a layer of Ti/Pt/Au 58, preferably having a thickness of 2,000 Å, is deposited through opening 56-1 followed by the deposition of a layer 60 of an Au/Si eutectic preferably with a 1,000 Å thickness. Layers 58-1 of Ti/Pt/Au and 60-1 of the Au/Si eutectic are thus formed, which layers preferably follow the outerperipheral shape of a capital letter 'E', as previously described.

Figure 18A:
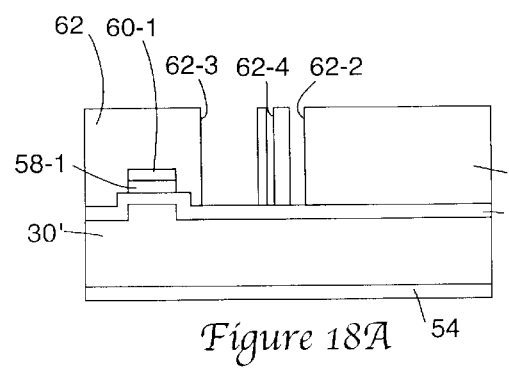
Figure 18B:
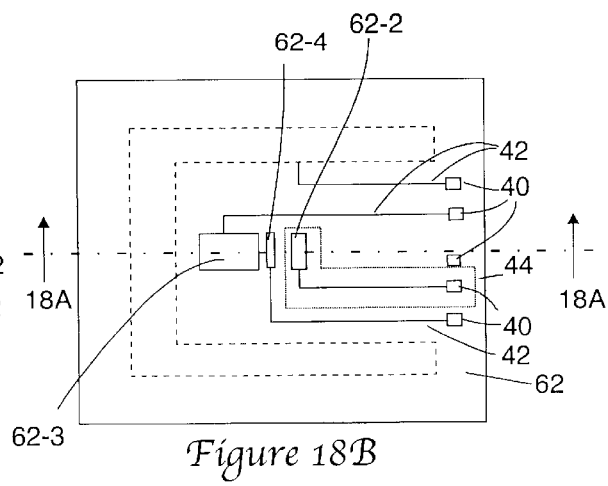

Photoresist layer 56 is then removed and a layer 62 of photoresist is applied and patterned to have (i) openings 62-2, 62-3 and 62-4, as shown in FIG. 18A, (ii) openings for pads 40-1 through 40-4 and their associated ribbon conductors 42 and (iii) an opening for guard ring 44 and its pad, as depicted in FIG. 18B. For the ease of illustration, the opening for guard ring 44 is not shown in FIG. 18A. As is shown by FIGS. 19A and 19B, a layer of Ti/Pt/Au is deposited over the photoresist and through openings 62-2 through 62-4 forming contacts 64-3, 64-4 and 64-2 as shown in FIGS. 19A and 19B. Those contacts are interconnected with their associated pads 40-2 through 44-4 by the aforementioned ribbon conductors 42, which contacts 40 and ribbon conductors 42 are preferably formed at the same time as contacts 64-3, 64-4 and 64-2 are formed. The outerperipheral layers 58-1 and 60-1 are also connected with pad 40-1 by an associated ribbon conductor 42. The layer 62 of photoresist is removed so that the base portion appears as shown in FIGS. 19A and 19B. The protrusion 30-1, which is approximately 20,000 Å high, and the relatively thin layers 58-1 and 60-1 for the mating structure for the base portion.

Turning to FIG. 20, the cantilever beam forming portion 2 according to the second embodiment is now bonded to base portion 4. As is shown in FIG. 20, the two wafers 10 and 30' are brought into a confronting relationship so that their mating structure 18-1 and 30-1, 58-1, 62-1 are in alignment so that layers 18-1 and 60-1 properly mate with each other. Pressure and beat (preferably by applying a force of 5,000 N at 400° C. between three inch wafers 2,4 having on the order of 1000 sensors disposed thereon) are applied so that eutectic bonding occurs between layers 18-1 and 60-1 as shown in FIG. 21. Thereafter, silicon wafer 10 is dissolved so that the MEM sensor structure shown in FIG. 22 is obtained. The p-type silicon layer 12 includes a portion 12-2 which serves as the cantilevered beam and another portion which is attached to the base portion 4 through the underlying layers. The gold contact 26-2 is coupled to pad 40-1 by elements 12-2, 12-1, 18-1, 60-1, 58-1 and its associated ribbon conductor 42.

Figure 23:
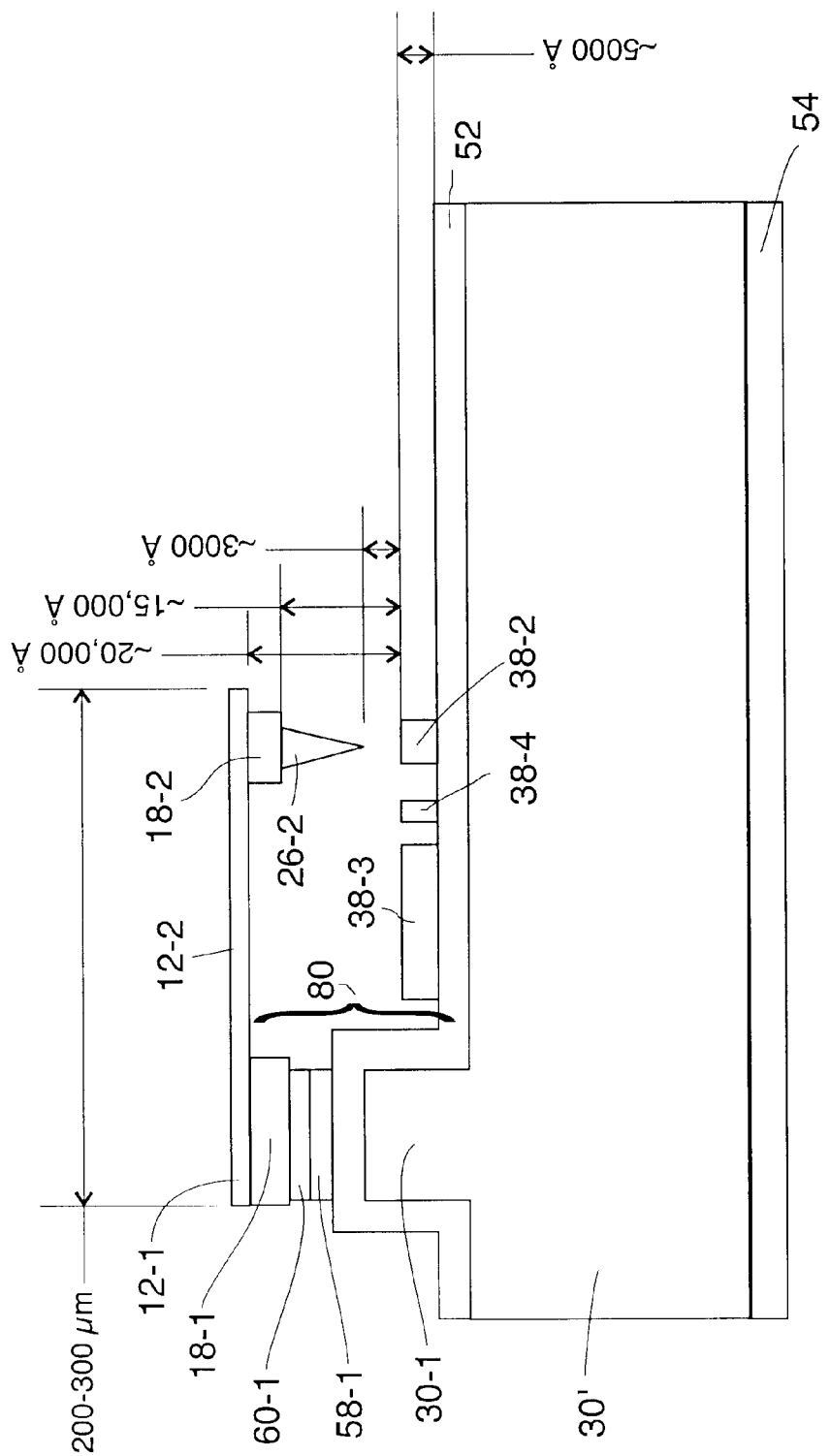

FIG. 23 is basically identical to FIG. 22, but shows the MEM sensor in somewhat more detail and the preferred dimensions of MEM sensor are also shown on this figure.

It will be recalled that in both the first and second embodiment discussed above with respect to FIG. 4B, a layer of Ti/Pt/Au 18 was applied forming contacts 18-1 and 18-2 which were sintered in order to form an ohmic bonds with Boron-doped cantilever 12. It was noted that sintering could be avoided by providing a ribbon conductor between contacts 18-1 and 18-2. Such a modification is now described in greater detail and is depicted starting with FIGS. 24A and 24B.

According to this modification, the thin Si layer 12 formed on silicon wafer 10 may be (i) doped with Boron or (ii) may be either undoped or doped with other impurities. If undoped (or doped with other impurities), then a thin etch stop layer 11 is used between the Si epitaxial layer 12 and the silicon wafer 10. This configuration is called Silicon On Insulator (SOI) and the techniques for malling an SOI structure are well known in the art and therefor are not described here in detail. The etch stop layer 11, preferably a layer of $SiO_2$ having a thickness of about 1–2 $\mu$m, can be made, for example, by the implantation of oxygen into the silicon wafer 10 through the exposed surface so as to form the etch stop layer 11 buried below the exposed surface of the silicon wafer 10 and thus also define, at the same time, the thin layer of silicon 12 adjacent the exposed surface. The thin layer 12 thus is preferably also made of a single crystalline structure having a <100> crystalline orientation. The etch stop layer 11, if used, is preferably a layer of $SiO_2$ having a thickness of about 1–2 $\mu$m. This etch stop layer 11 will be used to release the cantilevered beam from wafer 10. If layer 12 is doped with Boron, it is doped to reduce the resistivity of the epitaxial layer 12 to less than 1 $\Omega$-cm. At that level of Boron doping the epitaxial layer 12 can resist a subsequent EDP etch used to release the cantilevered beam from wafer 10 and thus an etch stop layer is not needed.

Figure 24A:
Figure 24B:
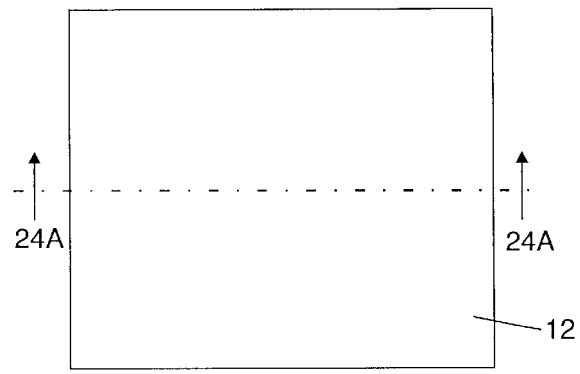

Optionally, the silicon wafer 10 with the thin doped or undoped Si layer 12 formed thereon (as shown in FIGS. 24A and 24B) may be subjected to thermal oxidation to form a relatively thin layer of $SiO_2$ on the exposed surface of layer 12. Layer 12 is preferably about 1.2 $\mu$m thick (but it can be thinner or thicker depending upon the application). The thickness of the optional $SiO_2$ layer is preferably on the order of 0.2 $\mu$m. To arrive at this point, both major surfaces may be oxidized and the oxide stripped from the bottom layer, if desired. The optional oxide layer may be used to provide an even better barrier against the diffusion of Si from the beam into the Au of the tunneling tip formed at one end of the beam. This optional oxide layer may be used with any embodiment of the cantilevered beam, but is omitted from most of the figures for ease of illustration. It does appear, however, in FIG. 41 of related Application Ser. No. 09/629,679 identified above and is identified there by element number 70.

Figure 25A:
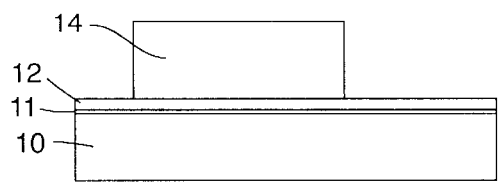
Figure 25B:
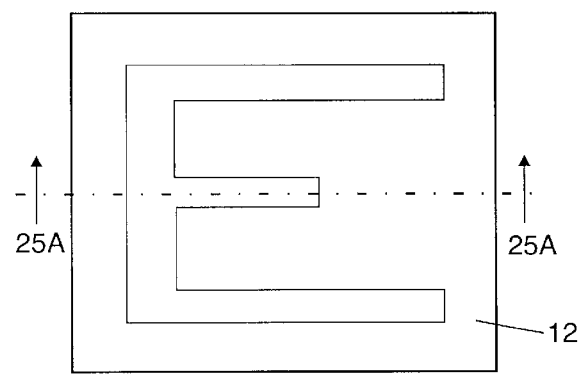
Figure 26A:
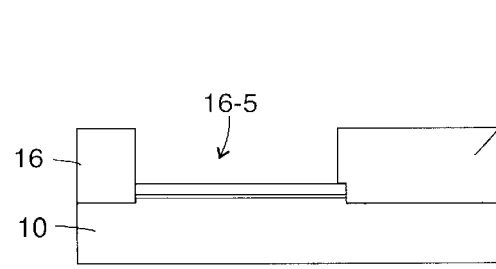
Figure 26B:
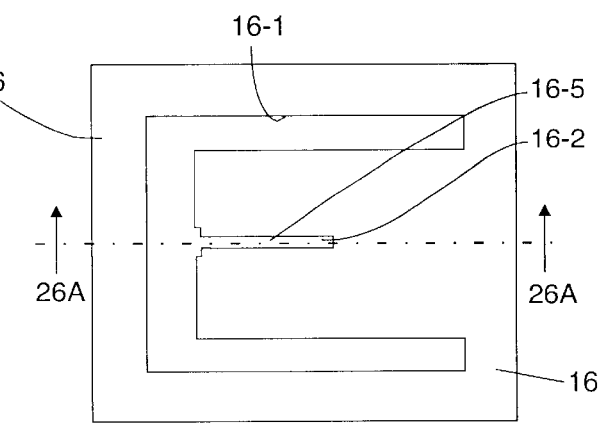

Turning now to FIGS. 25A and 25B, a layer of photoresist 14 is then applied on layer 12 (or on the optional oxide layer, if present) and patterned preferably to assume the same "E" letter shape as the layer photoresist 14 discussed with reference to FIGS. 2A and 2B. The structure shown in FIGS. 25A and 25B is then subjected to a plasma etch which etches through layers 11 and 12 into the silicon substrate 10 by approximately 500 Å. Then a layer of photoresist 16 is applied and patterned as shown by FIGS. 26A and 26B. The layer 16 of photoresist is patterned to assume basically the same arrangement and configuration as layer 16 discussed with respect to FIGS. 3A and 3B except that an additional opening 16-5 is included communicating between openings 61-1 and 16-2 to provide for the formation of a ribbon conductor 18-5 when a layer 18 of metals, preferably Ti/Pt/Au, is subsequently deposited on photoresist 16. After depositing the layer 18, the photoresist 16 is removed lifting off the portions of the layer 18 formed thereon, leaving portions 18-1, 18-2 and 18-5 of layer 18 on the underlying layer 12, as shown in FIGS. 27A and 27B, or on the optional oxide layer, if present.

Figure 27A:
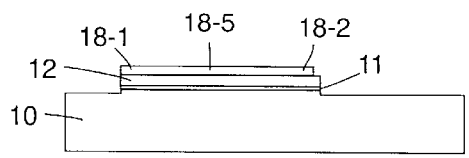
Figure 27B:
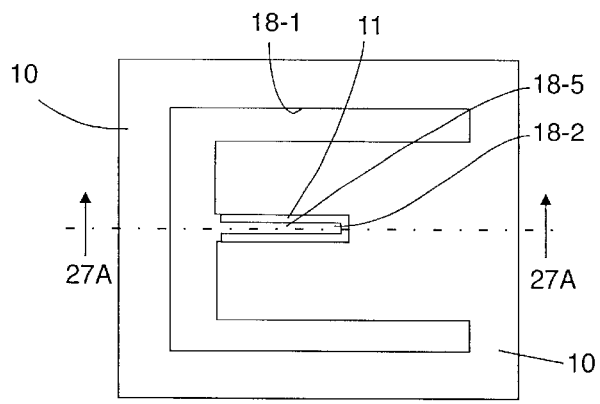
Figure 28A:
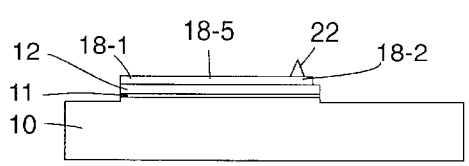
Figure 28B:
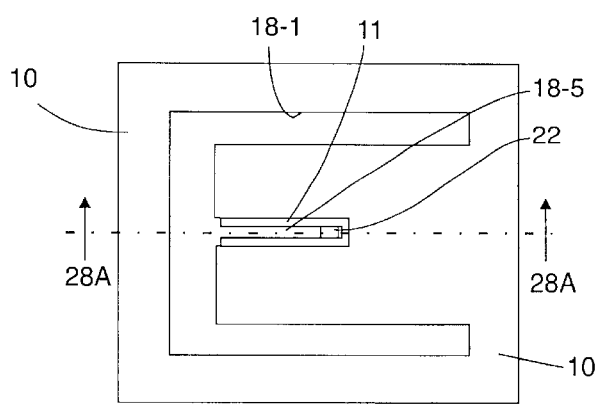
Figure 29A:
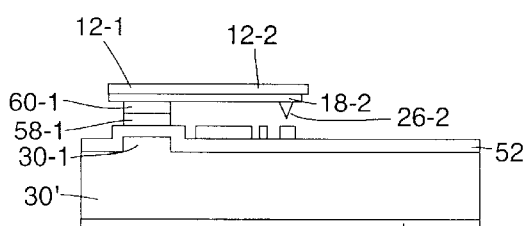
Figure 29B:
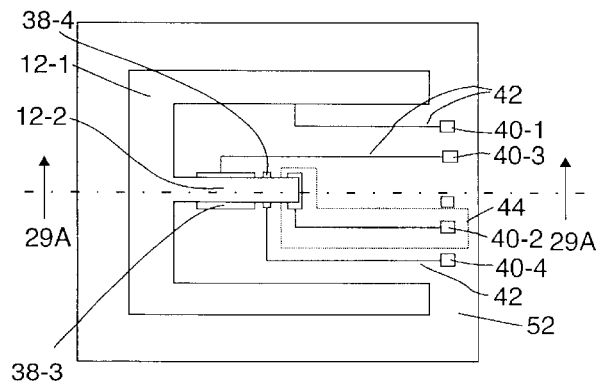

After arriving at the structure shown in FIGS. 27A and 27B, a tunneling tip 22 is added by appropriate masking and deposition of Au or a layer of Ti/Pt/Au, for example, thereby arriving at the structure shown by FIGS. 28A and 28B. Depending on the configuration utilized, a member 22-1 (see FIG. 6A) could be deposited at the same time so that the MEM sensor would be completed as previously described with reference to FIGS. 10 and 11. If instead the silicon base 30 is formed with a protrusion 30-1 (see FIG. 16A, for example), then the deposition of member 22-1 can be omitted and the MEM sensor can be completed as previously described with reference to FIGS. 20 and 21. After eutecticly bonding the structure depicted by FIGS. 28A and 28B to the base structure 4 of FIGS. 19A and 19B and releasing the silicon wafer 10 from the cantilevered beam, the structure shown by FIGS. 29A and 29B is arrived at. The cantilevered beam is preferably released by performing two plasma etches. The first etch dissolves wafer 10 and the second etch removes the etch stop layer 11.

Figure 30:
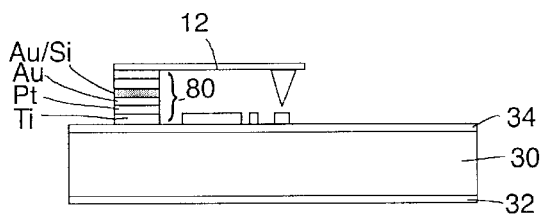
FIG. 30 depicts a side elevational section view of another embodiment of a MEM sensor, this embodiment having a eutectic bond in a central region of its columnar support.
Figure 31:
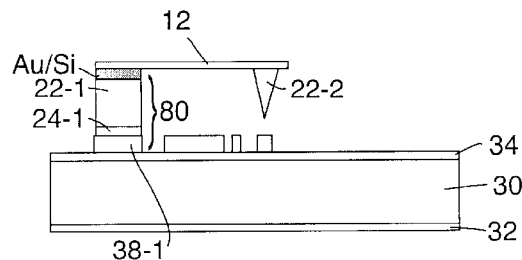
FIG. 31 depicts a side elevational section view of yet another embodiment of a MEM sensor, this embodiment having a eutectic bond adjacent the cantilevered beam 12.

FIG. 30 shows yet another embodiment of a MEM sensor. In this case the MEM sensor is shown in its completed form. With the information already presented herein, those skilled in the art will not find it difficult to modify the detailed description already given to produce this embodiment and still further embodiments, all of which will now be discussed. In the embodiment of FIGS. 1A–12B the eutectic bond occurs close to the silicon substrate 10 between layers 24-1 and 38-1. In the embodiment of FIG. 30, the eutectic bond occurs closer to a center point in the supporting arm 80 between the Au and Au/Si layers. Otherwise this embodiment is similar to the first embodiment described with reference to FIGS. 1A–12B. In the embodiment of FIG. 31, the eutectic bond occurs between the Au and Au/Si layers which are arranged close to the cantilevered beam 12 as opposed to close to base 4 as in the case of the first embodiment described with reference to FIGS. 1A–12B. In the case of the embodiments of FIGS. 30 and 31, the cantilevered beam 12 should have good conductivity so that it acts as a conduction path between contact 22-2 at the end of the beam 12 and contact 40-1 on the base 4 (See FIG. 12B). Preferably the resistivity of the boron doped silicon cantilevered beam 12 is less than 0.05 Ω-cm. Due to the low resistivity of the beam 12, EDP may be used to etch away substrate 10 (see FIGS. 10 and 11 and the related description). Alternatively, an SOI wafer could be used and the SiO$_2$ layer 11 (FIGS. 24A–28B) would be used as an etch stop layer to protect the beam 12 when etching away substrate 10.

Comparing the embodiments of FIGS. 10, 23, 29 and 30, the embodiments of FIGS. 23 and 29 are preferred since they only need a relatively thin metal mating layer and provide a more rigid Si post or protrusion 30-1 for better stability.

Figure 32:
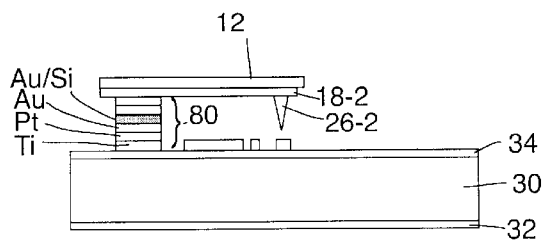
FIG. 32 depicts a side elevational section view of still another embodiment of a MEM sensor, this embodiment having a eutectic bond in a central region of its columnar support as in the embodiment of FIG. 30, but also having a ribbon conductor on the cantilevered beam structure.
Figure 33:
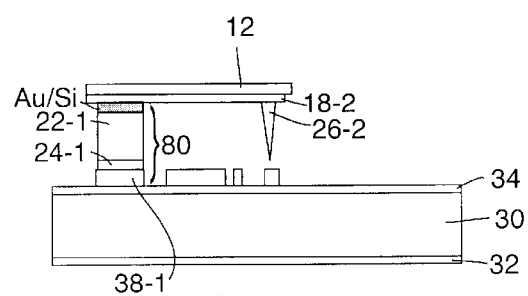
FIG. 33 depicts a side elevational section view of another embodiment of a MEM sensor, t this embodiment having a eutectic bond adjacent the cantilevered beam structure as in the case of the embodiment of FIG. 31, but also having a ribbon conductor on the cantilevered beam structure.
Figure 34:
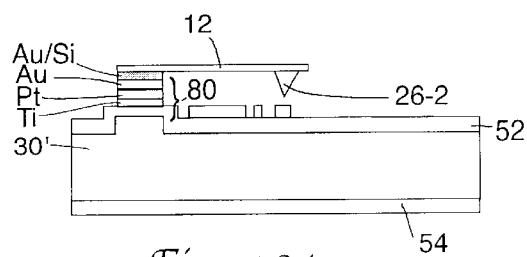
FIG. 34 depicts a side elevational section view of still another embodiment of a MEM sensor, this embodiment having a eutectic bond adjacent the cantilevered beam, but also utilizing a base structure having a silicon protrusion which forms part of the columnar support structure.
Figure 35:
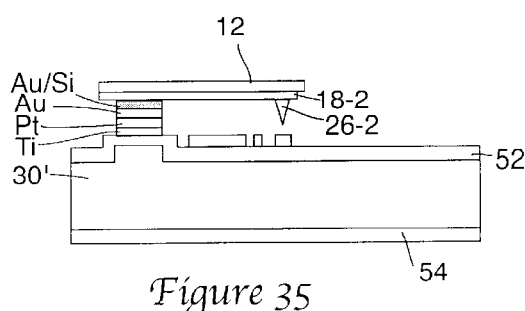
FIG. 35 depicts a side elevational section view of yet another embodiment of a MEM sensor, this embodiment having a eutectic bond adjacent the cantilevered beam and utilizing a base structure having a silicon protrusion which forms part of the columnar support structure as in the case of the embodiment of FIG. 34, but also utilizing a ribbon conductor on the cantilevered beam structure.
Figure 38:
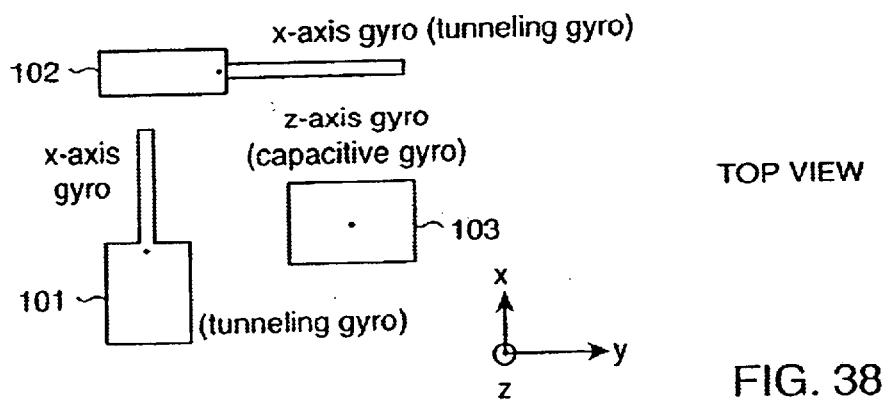
FIG. 38 depicts a plan view of a three axis sensor arrangement of three sensors.
Figure 39:
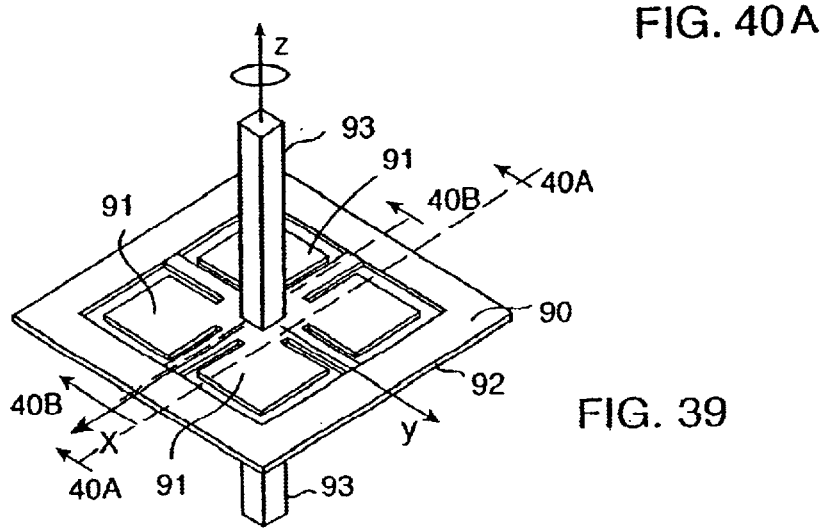
FIG. 39 is a perspective view of the z-axis sensor of FIG. 38.

The embodiments of FIGS. 32 and 33 are similar to the embodiments of FIGS. 29 and 30, but these two embodiments make use of the ribbon conductor 18-5 described with reference to FIGS. 24A through 29B. For these embodiments, if layer is doped with Boron, the resistivity of the cantilevered beam 12 is preferably less than 1 Ω-cm. The ribbon conductor allows the use of higher resistivity silicon for the cantilevered beam 12. If layer 12 is doped with Boron, then the cantilevered beam can be released from wafer 10 using EDP as the etchant. Alternatively, an SIO construction can be utilized with a SiO$_2$ stop layer 11 (See FIGS. 24A–28B) utilized to protect the beam 12 while the substrate 10 is etched away.

The embodiments of FIGS. 34–37 are similar to the embodiment of FIGS. 29, 31, 30 and 32, respectively, except instead of using a planar substrate, a substrate with a silicon protrusion 30-1 is utilized as described with reference to the second embodiment (see FIGS. 13A–23 and the related description).

Generally speaking, the embodiments of FIGS. 13A–23 and 34–37 are preferred for a MEM sensor since these embodiments, which all utilize the a base substrate 30' with a silicon post or protrusion 30-1, are believed to give the resulting sensors better mechanical stability.

The structures which have been described so far and in the U.S. patent applications incorporated herein by reference each provide a single sensor. Of course, many sensors are manufactured at one time on a common substrate or wafer. Indeed, neighboring sensors can be associated and orthogonally positioned with respect to one another so that the resulting pairs of sensors are sensitive in two different directions. See FIG. 38 where two tunneling sensors 101 and 102 are arranged such that their cantilevered beams 12 are disposed along the x and y axes, respectively. A third capacitive sensor 103 is provided which is sensitive along the z axis. The resulting sensor thus has three axis sensitivity. Sensor 103 can be of the type disposed in U.S. Pat. No. 5,226,321, for example. Alternatively, the third sensor 103 may be a four cloverleaf sensing configuration known in the art. The cloverleaf design includes a suspended plate 90 which is etched through to define square-shaped cloverleaf patterns 91 therein and a peripheral edge 92 (see FIGS. 39, 40A and 40B). A post 93 is bonded to the center of plate 90 on at least one surface thereof by, for example, epoxy cement at numeral 94. The post 93 is usually allowed to move along the z-axis and the cloverleaf patterns 91 move therewith. Appropriate electrodes 95 are provided for sensing movement of the suspended plate and post.

The two orthogonally arranged sensors may be tunnelling rotation rate sensors of the type disclosed in U.S. patent application Ser. No. 09/629,679 entitled "A Single Crystal, Dual Wafer, Gyroscope and a Method of Making Same" filed Aug. 1, 2002 now U.S. Pat. No. 6,555,404. As indicated above, the disclosure of that patent application is incorporated herein by reference.

The mating structure disposed at the peripheral edge 92 of the suspended plate 90 is eutecticly bonded to a support structure 96 associated with sensor 103 in a fashion very similar to the manner in which the cantilevered beam 12 of FIG. 23 is bonded to its support structure. See FIG. 40B. As such, the support structure 96 is preferably formed with a silicon projection 96-1 which projects from the base structure 96 in base portion 4. Layers 58-7 of Ti/Pt/Au and 60-7 of the Au/Si eutectic are thus formed, which layers preferably follow the outerperipheral shape of the support structure of sensor 103. Layers 58-7 and 60-7 are preferably formed at the same time that layer 58 and 60 are deposited, for example, when making sensors 101 and 102 in accordance with the embodiment of FIG. 23.

Plate 90 is preferably formed at about the same time that cantilevered beams 12 of sensors 101 and 102 are formed in the cantilevered beam portion 2. The cantilevered beams 12 include a multi-layer 18-1 formed of Ti/Pt/Au and the mating structure for plate 90 is preferably provided with by multi-layer 18-7 formed of Ti/Pt/Au at the outerperipheral edge of plate 90. layer 18-7 is preferably formed at the same time that layer 18 is deposited in the manufacture of the cantilevered beam structures. Posts 93 are formed. After the cantilevered beam portion 2 and the base portion 4 are formed, they are mechanically aligned. As previously mentioned, pressure and heat are applied so that eutectic bonding occurs between layers 18-1 and 60-1 as shown in FIGS. 21 and 23 and at the same time eutectic bonding occurs between layers 18-7 and 60-7 as shown in FIG. 40B.

Figure 40A:
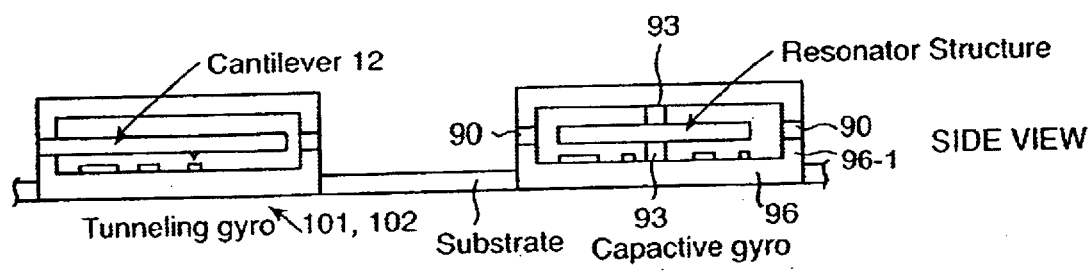
FIG. 40A is a schematic side elevational section view of the three axis sensor of FIG. 38.
Figure 40B:
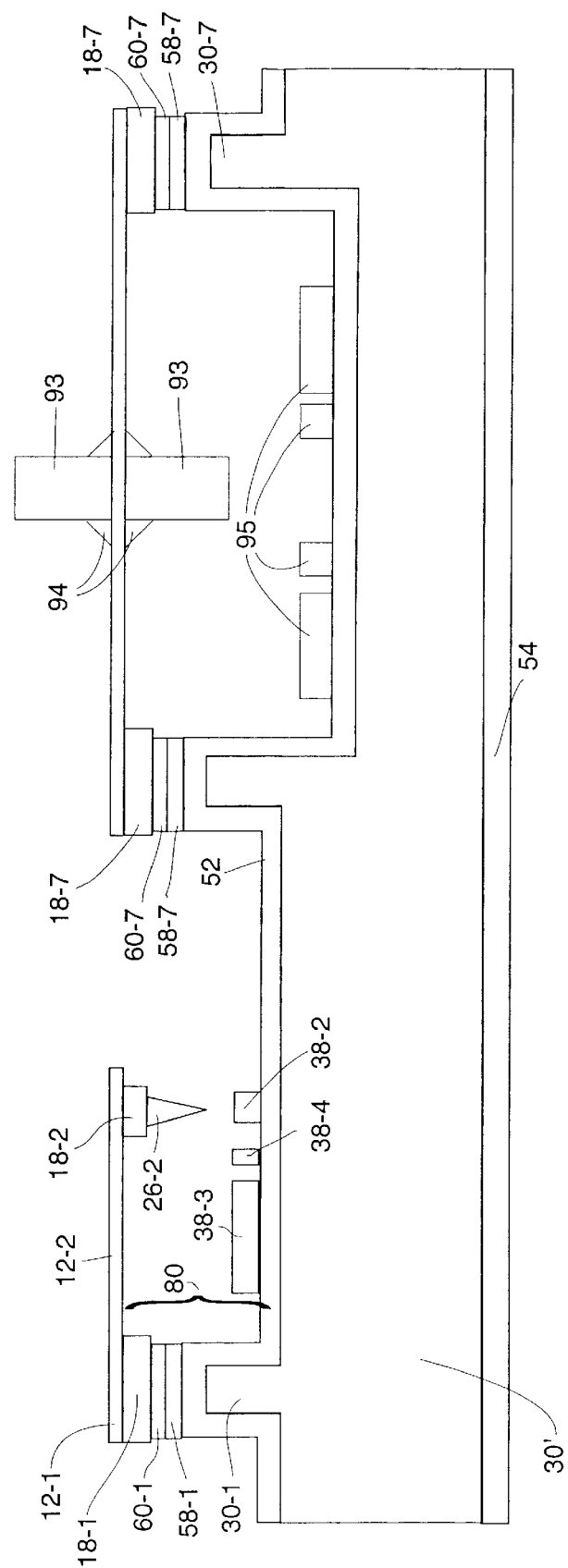
FIG. 40B is a more detailed side elevational view of thereof.
Figure 40C:
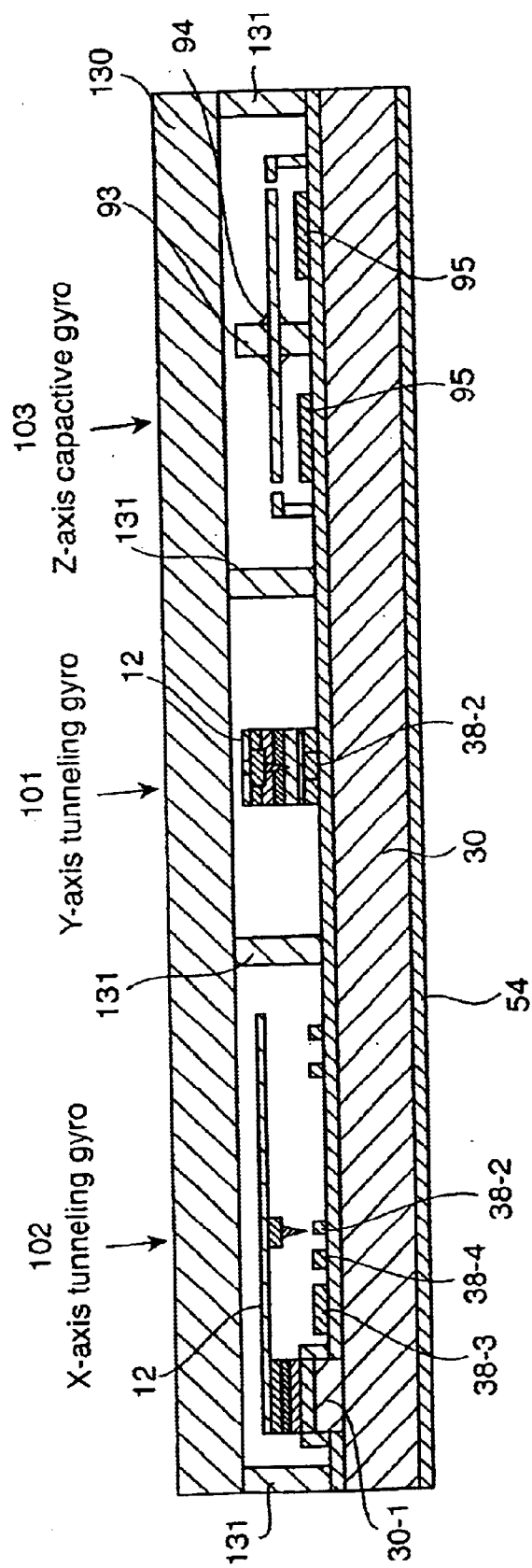
FIG. 40C is a side elevational view of another embodiment thereof.

FIG. 40C is similar to FIG. 40B. In this embodiment, two tunneling gyros 101 and 102 can be seen on a common substrate 30. The two gyros are arranged along x and y axes. A z-axes gyro is shown at numeral 103. In this embodiment, the three gyros are preferably encapsulated in a vacuum in a space defined by defined by substrate 30, walls 131 and top plate 130. The top plate 130 and walls 131 may be eutectically bonded as previously described with reference to the manner by which the cantilevered beams 12 are fixed in place.

The structures shown in the drawings has been described in many instances with reference to a capital letter 'E'. However, this shape is not particularly critical, but it is preferred since it provides good mechanical support for the cantilevered structure formed primarily by beam portion of layer 12. Of course, the shape of the supporting structure or mating structure around cantilever beam 12 can be changed as a matter of design choice and it need not form the perimeter of the capital letter 'E', but can form any convenient shape, including circular, triangular or other shapes as desired.

In the embodiment utilizing a ribbon conductor on the cantilevered beam 12, the pads and contacts (e.g. 26-2 and 26-3) formed on the beam 12 are generally shown as being formed over) the ribbon conductor 18-1, 18-2, 18-5. The ribbon conductor on the beam can be routed in any convenient fashion and could butt against or otherwise make contact with the other metal elements formed on the cantilevered beam 12 in which case elements such as 26-2 and 29-3 could be formed directly on the beam 12 itself.

The contacts at the distal ends of the cantilevered beams are depicted and described as being conical or triangular. Those skilled in the art will appreciate that those contacts may have other configurations and may be flat in some embodiments.

Throughout this description are references to Ti/Pt/Au layers. Those skilled in the art will appreciate that this nomenclature refers to a situation where the Ti/Pt/Au layer comprises individual layers of Ti, Pt and Au. The Ti layer promotes adhesion, while the Pt layer acts as a barrier to the diffusion of Si from adjacent layers into the Au. It is desirable to keep Si from migrating into the Au since if Si diffuses into Au contacts it will tend to form $SiO_2$ on the exposed surface and since $SiO_2$ is a dielectric, it has deleterious effects on the ability of Au contacts to perform their intended function.

Many different embodiments of a MEM device have been described. Most are sensors and some are switches. Many more embodiments can certainly be envisioned by those skilled in the art based the technology disclosed herein. But in all cases the base structure 4 is united with the cantilevered beam forming structure 2 by applying pressure and preferably also heat to cause an eutectic bond to occur between the then exposed layers of the two structures 2 and 4.

Having described the invention with respect to certain preferred embodiments thereof, modification will now suggest itself to those skilled in the art. The invention is not to be limited to the foregoing description, except as required by the appended claims.

What is claimed is:

1. A three axis MEM tunneling sensor assembly for making a three axis MEM tunneling sensor therefrom, the assembly comprising:

(a) orthogonally arranged beam structures, a resonator structure and associated mating structures defined on a first substrate or wafer;

(b) contact structures and mating structures defined on a second substrate or wafer, the mating structures on the second substrate or wafer being of a complementary shape to the mating structures on the first substrate or wafer; and (c) a pressure/heat sensitive bonding layer disposed on said mating structures on at least one of said first and second substrates or wafers for bonding the mating structures defined on the first substrate or wafer to mating structures on the second substrate or wafer in response to the application of pressure/heat therebetween.

2. A three axis MEM tunneling sensor assembly as claimed in claim 1 wherein the second substrate or wafer is formed of silicon.

3. A three axis MEM tunneling sensor assembly as claimed in claim 2 wherein the silicon forming the second substrate or wafer is of a single crystalline structure.

4. A three axis MEM tunneling sensor assembly as claimed in claim 3 wherein the crystalline structure of the silicon is <100>.

5. A three axis MEM tunneling sensor assembly as claimed in claim 4 wherein the silicon is n-type.

6. A three axis MEM tunneling sensor assembly as claimed in claim 1 wherein the first substrate or wafer is formed of silicon.

7. A three axis MEM tunneling sensor assembly as claimed in claim 6 wherein the silicon forming the first substrate or wafer is of a single crystalline structure.

8. A three axis MEM tunneling sensor assembly as claimed in claim 7 wherein the crystalline structure of the silicon in the first substrate or wafer is <100>.

9. A three axis MEM tunneling sensor assembly as claimed in claim 8 wherein the silicon of the first substrate or wafer is n-type silicon.

10. A three axis MEM tunneling sensor assembly as claimed in claim 1 wherein the cantilevered beam and resonator structures are formed from an epitaxial layer of silicon on said first substrate or wafer, said epitaxial layer being doped with a dopant.

11. A three axis MEM tunneling sensor assembly as claimed in claim 10 wherein a pointed contact is disposed on an end of said beam structure.

12. A three axis MEM tunneling sensor assembly as claimed in claim 10 wherein the epitaxial layer is doped with Boron at a sufficient concentration to reduce the resistivity of the epitaxial layer to less than 0.05 Ω-cm.

13. A three axis MEM tunneling sensor assembly as claimed in claim 12 further including first and second ohmic Ti/Pt/Au contacts on said epitaxial layer, said second ohmic contact being disposed near a distal end of the beam structure and said first ohmic contact forming the mating structure on the first substrate or wafer.

14. A three axis MEM tunneling sensor assembly as claimed in claim 13 wherein a relatively thick layer of Ti/Pt/Au is disposed on the first and second ohmic Ti/Pt/Au contacts, a first portion of the relatively thick layer of Ti/Pt/Au being disposed on said first ohmic Ti/Pt/Au contact and providing the mating structure on the first substrate and a second portion of the relatively thick layer of Ti/Pt/Au forming a pointed contact on said second ohmic Ti/Pt/Au contact.

15. A three axis MEM tunneling sensor assembly as claimed in claim 14 further including Ti/Pt/Au contacts disposed on said second substrate or wafer, at least one of said contacts on the second substrate or wafer defining the mating structure on the second substrate or wafer.

16. A three axis MEM tunneling sensor assembly as claimed in claim 15 wherein the bonding layer is provided by a layer of Au—Si eutectic disposed on the Ti/Pt/Au contact on said second substrate and/or by a layer of Au—Si eutectic disposed on the first portion of the relatively thick layer of Ti/Pt/Au on the first substrate or wafer.

17. A three axis MEM tunneling sensor assembly as claimed in claim 15 wherein the silicon for the eutectic bond is provided by the silicon substrate of the first or second substrates or wafers at the mating structure.

18. A three axis MEM tunneling sensor assembly as claimed in claim 12 further including first and second ohmic contacts on said epitaxial layer, said second ohmic contact being disposed near a distal end of the beam structure and said first ohmic contact forming the mating structure on the first substrate or wafer.

19. A three axis MEM tunneling sensor assembly as claimed in claim 18 further including a protruding portion which protrudes from a major surface of said second substrate or wafer and Ti/Pt/Au contacts on said second substrate or wafer, at least one of said contacts on the second substrate or wafer defining, in combination with the protruding portion, the mating structure on the second substrate or wafer.

20. A three axis MEM tunneling sensor assembly as claimed in claim 19 wherein the bonding layer is provided by a layer of Au—Si eutectic disposed on the Ti/Pt/Au contact on said second substrate and/or by a layer of Au—Si eutectic disposed on first ohmic contact.

21. A three axis MEM tunneling sensor assembly as claimed in claim 10 wherein first and second interconnected Ti/Pt/Au contacts are disposed on said epitaxial layer, the contacts being interconnected by an elongate ribbon layer of Ti/Pt/Au, said second interconnected contact being disposed near a distal end of the beam structure, the elongate ribbon being disposed longitudinally on the beam structure and said first interconnected contact forming the mating structure on the first substrate or wafer.

22. A three axis MEM tunneling sensor assembly as claimed in claim 21 wherein a protruding portion protrudes from a major surface of said second substrate or wafer, Ti/Pt/Au contacts are disposed on said second substrate or wafer, at least one of said contacts on the second substrate or wafer defining, in combination with the protruding portion, the mating structure on the second substrate or wafer.

23. A three axis MEM tunneling sensor assembly as claimed in claim 22 wherein the bonding layer is provided by a layer of Au—Si eutectic disposed on the Ti/Pt/Au contact on said second substrate and/or by a layer of Au—Si eutectic disposed on first interconnected contact.

24. A three axis MEM tunneling sensor assembly as claimed in claim 1 wherein a center post in a resonator structure is bonded to the mating structure on the second substrate or wafer.

25. A three axis MEM tunneling sensor assembly as claimed in claim 1 wherein an outer frame of the resonator structure is bonded to the mating structure on the second substrate or wafer.

26. A three axis MEM tunneling sensor assembly comprising:
(a) orthogonally arranged beam structures, an associated resonator structure and associated mating structures arranged on a first substrate or wafer;
(b) contact structures and associated mating structures defined on a second substrate or wafer, the mating structures on the second substrate or wafer being of a complementary shape to the mating structures on the first substrate or wafer; and
(c) an eutectic bonding layer disposed on said mating structures on at least one of the substrates or wafers for bonding the mating structures defined on the first substrate or wafer to mating structures on the second substrate or wafer in response to the application of pressure and heat therebetween, the mating structures being joined one to another at said eutectic bonding layer.

27. A three axis MEM tunneling sensor assembly as claimed in claim 26 wherein the first and second substrates or wafers are each formed of single crystal silicon.

28. A three axis MEM tunneling sensor assembly as claimed in claim 26 wherein the crystalline structure of the silicon is <100>.

29. A three axis MEM tunneling sensor assembly as claimed in claim 26 wherein the cantilevered beam structure is formed from an epitaxial layer of silicon on said first substrate or wafer, said epitaxial layer being doped with a dopant.

30. A three axis MEM tunneling sensor assembly as claimed in claim 29 wherein the epitaxial layer is doped with Boron at a sufficient concentration to reduce the resistivity of the epitaxial layer to less than 0.05 Ω-cm.

31. A three axis MEM tunneling sensor assembly as claimed in claim 29 further including first and second ohmic contacts on said epitaxial layer, said second ohmic contact being disposed near a distal end of the beam structure and said first ohmic contact forming the mating structure on the first substrate or wafer.

32. A three axis MEM tunneling sensor assembly as claimed in claim 31 wherein a relatively thick layer of metal is disposed on the first and second ohmic contacts, a first portion of the relatively thick layer of metal being disposed on said first ohmic contact and providing the mating structures on the first substrate or wafer and a second portion of the relatively thick layer of metal forming a pointed contact on said second ohmic contact.

33. A three axis MEM tunneling sensor assembly as claimed in claim 32 further including metal contacts disposed on said second substrate or wafer, at least one of said contacts on the second substrate or wafer defining the mating structure on the second substrate or wafer.

34. A three axis MEM tunneling sensor assembly as claimed in claim 33 wherein the bonding layer is provided by a layer of Au—Si eutectic disposed on the metal contact on said second substrate and/or by a layer of Au—Si eutectic disposed on the first portion of the relatively thick layer of metal on the first substrate or wafer.

35. A three axis MEM tunneling sensor assembly as claimed in claim 33 wherein the silicon for the eutectic bond is provided by the silicon substrate of the first or second substrates or wafers at the mating structure.

36. A three axis MEM tunneling sensor assembly as claimed in claim 30 further including first and second ohmic contacts on said epitaxial layer, said second ohmic contact being disposed near a distal end of the beam structure and said first ohmic contact forming the mating structure on the first substrate or wafer.

37. A three axis MEM tunneling sensor assembly as claimed in claim 26 further including a protruding portion which protrudes from a major surface of said second substrate or wafer and metal contacts on said second substrate or wafer, at least one of said contacts on the second substrate or wafer defining, in combination with the protruding portion, the mating structure on the second substrate or wafer.

38. A three axis MEM tunneling sensor assembly as claimed in claim 37 wherein the bonding layer is provided by a layer of Au—Si eutectic disposed on the metal contact on said second substrate and/or by a layer of Au—Si eutectic disposed on first ohmic contact.

39. A three axis MEM tunneling sensor assembly as claimed in claim 26 wherein first and second interconnected metal contacts are disposed on said epitaxial layer, the contacts being interconnected by an elongate ribbon of metal, said second interconnected contact being disposed near a distal end of the beam structure, the elongate ribbon being disposed longitudinally on the beam structure and said first interconnected contact forming the mating structure on the first substrate.

40. A three axis MEM tunneling sensor assembly as claimed in claim 39 wherein a protruding portion protrudes from a major surface of said second substrate or wafer, metal contacts are disposed on said second substrate or wafer, at least one of said contacts on the second substrate or wafer defining, in combination with the protruding portion, the mating structure on the second substrate or wafer.

41. A three axis MEM tunneling sensor assembly as claimed in claim 40 wherein the bonding layer is provided by a layer of Au—Si eutectic disposed on the metal contact on said second substrate and/or by a layer of Au—Si eutectic disposed on first interconnected contact.

42. A three axis MEM tunneling sensor assembly as claimed in claim 26 wherein a center post in the resonator structure is bonded to the mating structure on the second substrate or wafer.

43. A three axis MEM tunneling sensor assembly as claimed in claim 26 wherein an outer frame of the resonator structure is bonded to the mating structure on the second substrate or wafer.

44. A three axis MEM tunneling/capacitive sensor as claimed in claim 1 in which a third wafer is bonded to the top of the sensor in a vacuum to vacuum seal the sensor.

45. A three axis MEM tunneling/capacitive sensor, the sensor comprising:
(a) a X-axis tunneling gyro disposed on a first substrate or wafer;
(b) a Y-axis tunneling gyro disposed on the first substrate or wafer;
(c) a Z-axis capacitive gyro disposed on the first substrate or wafer;
(d) a second substrate or wafer; and
(e) mating structures on at least one of said first and second substrates or wafers for mating the first substrate or wafer to the second substrate or wafer.

46. A three axis MEM tunneling/capacitive sensor assembly as claimed in claim 45 wherein the second substrate or water is formed of silicon.

47. A three axis MEM tunneling/capacitive sensor assembly as claimed in claim 46 wherein the silicon forming the second substrate or wafer consists of a single crystalline structure.

48. A three axis MEM tunneling/capacitive sensor assembly as claimed in claim 47 wherein the crystalline structure of the silicon is <100>.

49. A three axis MEM tunneling/capacitive sensor assembly as claimed in claim 48 wherein the silicon is n-type.

50. A three axis MEM tunneling/capacitive sensor assembly as claimed in claim 45 wherein the first substrate or wafer is formed of silicon.

51. A three axis MEM tunneling/capacitive sensor assembly as claimed in claim 50 wherein the silicon forming the first substrate or wafer consists of a single crystalline structure.

52. A three axis MEM tunneling/capacitive sensor assembly as claimed in claim 51 wherein the crystalline structure of the silicon in the first substrate or wafer is <100>.

53. A three axis MEM tunneling/capacitive sensor assembly as claimed in claim 52 wherein the silicon of the first substrate or wafer is n-type silicon.

54. A three axis MEM tunneling/capacitive sensor assembly as claimed in claim 45 wherein the X-axis tunneling gyro and the Y-axis tunneling gyro each include a cantilevered beam structure and wherein the Z-axis capacitive gyro includes a cantilevered beam and a resonator structure formed from an epitaxial layer of silicon on said first substrate or wafer, said epitaxial layer being doped with a dopant.

55. A three axis MEM tunneling/capacitive sensor assembly as claimed in claim 54 wherein a pointed contact is disposed on an end of said beam structure.

56. A three axis MEM tunneling/capacitive sensor assembly as claimed in claim 54 wherein the epitaxial layer is doped with Boron at a sufficient concentration to reduce the resistivity of the epitaxial layer to less than 0.05 $\Omega$-cm.

57. A three axis MEM tunneling/capacitive sensor assembly as claimed in claim 56 further including first and second ohmic Ti/Pt/Au contacts on said epitaxial layer, said second ohmic contact being disposed near a distal end of the beam structure and said first ohmic contact forming the mating structure on the first substrate or wafer.

58. A three axis MEM tunneling/capacitive sensor assembly as claimed in claim 57 wherein a relatively thick layer of Ti/Pt/Au is disposed on the first and second ohmic Ti/Pt/Au contacts, a first portion of the relatively thick layer of Ti/Pt/Au being disposed on said first ohmic Ti/Pt/Au contact and providing the mating structure on the first substrate and a second portion of the relatively thick layer of Ti/Pt/Au forming a pointed contact on said second ohmic Ti/Pt/Au contact.

59. A three axis MEM tunneling sensor assembly as claimed in claim 58 further including Ti/Pt/Au contacts disposed on said second substrate or wafer, at least one of said contacts on the second substrate or wafer defining the mating structure on the second substrate or wafer.

60. A three axis MEM tunneling/capacitive sensor assembly as claimed in claim 59 wherein a bonding layer is provided by a layer of Au—Si eutectic disposed on the Ti/Pt/Au contact on said second substrate or wafer and/or by a layer of Au—Si eutectic disposed on the first portion of the relatively thick layer of Ti/Pt/Au on the first substrate or wafer.

61. A three axis MEM tunneling/capacitive sensor assembly as claimed in claim 59 wherein the silicon for the eutectic bond is provided by the silicon substrate of the first or second substrates or wafers at the mating structure.

62. A three axis MEM tunneling/capacitive sensor assembly as claimed in claim 56 further including first and second ohmic contacts on said epitaxial layer, said second ohmic contact being disposed near a distal end of the beam structure and said first ohmic contact forming the mating structure on the first substrate or wafer.

63. A three axis MEM tunneling/capacitive sensor assembly as claimed in claim 62 further including a protruding portion which protrudes from a major surface of said second substrate or wafer and Ti/Pt/Au contacts on said second substrate or wafer, at least one of said contacts on the second substrate or wafer defining, in combination with the protruding portion, the mating structure on the second substrate or wafer.

64. A three axis MEM tunneling/capacitive sensor assembly as claimed in claim 63 wherein a bonding layer is provided by a layer of Au—Si eutectic disposed on the Ti/Pt/Au contact on said second substrate or wafer and/or by a layer of Au—Si eutectic disposed on first ohmic contact.

65. A three axis MEM tunneling/capacitive sensor assembly as claimed in claim 54 wherein first and second interconnected Ti/Pt/Au contacts are disposed on said epitaxial layer, the contacts being interconnected by an elongate ribbon layer of Ti/Pt/Au, said second interconnected contact being disposed near a distal end of the beam structure, the elongate ribbon being disposed longitudinally on the beam structure and said first interconnected contact forming the mating structure on the first substrate or wafer.

66. A three axis MEM tunneling/capacitive sensor assembly as claimed in claim 65 wherein a protruding portion protrudes from a major surface of said second substrate or water, Ti/Pt/Au contacts are disposed on said second substrate or wafer, at least one of said contacts on the second substrate or wafer defining, in combination with the protruding portion, the mating structure on the second substrate or wafer.

67. A three axis MEM tunneling/capacitive sensor assembly as claimed in claim 66 wherein a bonding layer is provided by a layer of Au—Si eutectic disposed on the Ti/Pt/Au contact on said second substrate and/or by a layer of Au—Si eutectic disposed on first interconnected contact.

68. A three axis MEM tunneling/capacitive sensor assembly as claimed in claim 45 wherein a center post in a resonator structure of the Z-axis capacitive gyro is bonded to the mating structure on the second substrate or wafer.

69. A three axis MEM tunneling/capacitive sensor assembly as claimed in claim 45 wherein an outer frame of a resonator structure of the Z-axis capacitive gyro is bonded to the mating structure on the second substrate or wafer.

70. A three axis MEM tunneling/capacitive sensor assembly comprising:

(a) a first substrate or wafer formed of silicon;
(b) two orthogonally arranged tunneling sensors, each tunneling sensor including at least a cantilevered beam structure formed of silicon on said first substrate or wafer;
(c) an orthogonally arranged capacitive gyro having a resonator structure, the capacitive gyro being sensitive on an axis which is orthogonally disposed to the beam structures of the two tunneling sensors, the resonator structure being formed of silicon on said first substrate or wafer;
(d) a mating structure arranged on the first substrate or wafer;
(e) at least one contact structure and an associated mating structure defined on a second substrate or wafer, the mating structure on the second substrate or wafer being of a complementary shape to the mating structure on the first substrate or wafer;
(f) an eutectic bonding layer disposed on said mating structure of at least one of the substrates or wafers for bonding the mating structure defined on the first substrate or wafer to the mating structure on the second substrate in response to the application of pressure and heat therebetween, the mating structures of the first and second substrates or wafers being joined one to another at said eutectic bonding layer; and
(g) the first substrate or wafer being dissolvable by a solvent while the beam structures and resonator structure formed on the first substrate or wafer are resistant to being dissolved by said solvent.

71. A three axis MEM tunneling/capacitive sensor assembly as claimed in claim 70 wherein the first and second substrates or wafers are each formed of single crystal silicon.

72. A three axis MEM tunneling/capacitive sensor assembly as claimed in claim 71 wherein the crystalline structure of the silicon is <100>.

73. A three axis MEM tunneling/capacitive sensor assembly as claimed in claim 70 wherein the cantilevered beam structure is formed from an epitaxial layer of silicon on said first substrate or wafer, said epitaxial layer being doped with a dopant.

74. A three axis MEM tunneling/capacitive sensor assembly as claimed in claim 73 wherein the epitaxial layer is doped with Boron at a sufficient concentration to reduce the resistivity of the epitaxial layer to less than 0.05 Ω-cm.

75. A three axis MEM tunneling/capacitive sensor assembly as claimed in claim 73 further including first and second ohmic contacts on said epitaxial layer, said second ohmic contact being disposed near a distal end of the beam structure and said first ohmic contact forming the mating structure on the first substrate or wafer.

76. A three axis MEM tunneling/capacitive sensor assembly as claimed in claim 75 wherein a relatively thick layer of metal is disposed on the first and second ohmic contacts, a first portion of the relatively thick layer of metal being disposed on said first ohmic contact and providing the mating structure on the first substrate or wafer and a second portion of the relatively thick layer of metal forming a pointed contact on said second ohmic contact.

77. A three axis MEM tunneling/capacitive sensor assembly as claimed in claim 76 further including metal contacts disposed on said second substrate or wafer, at least one of said contacts on the second substrate or wafer defining the mating structure on the second substrate or wafer.

78. A three axis MEM tunneling/capacitive sensor assembly as claimed in claim 77 wherein the eutectic bonding layer is provided by a layer of Au—Si eutectic disposed on the metal contact on said second substrate or wafer and/or by a layer of Au—Si eutectic disposed on the first portion of the relatively thick layer of metal on the first substrate or wafer.

79. A three axis MEM tunneling/capacitive sensor assembly as claimed in claim 77 wherein the silicon for the eutectic bond is provided by the silicon substrate of the first or second substrates or wafers at the mating structure.

80. A three axis MEM tunneling/capacitive sensor assembly as claimed in claim 74 further including first and second ohmic contacts on said epitaxial layer, said second ohmic contact being disposed near a distal end of the beam structure and said first ohmic contact forming the mating structure on the first substrate or wafer.

81. A three axis MEM tunneling/capacitive sensor assembly as claimed in claim 70 further including a protruding portion which protrudes from a major surface of said second substrate or wafer and metal contacts on said second substrate or wafer, at least one of said contacts on the second substrate or wafer defining, in combination with the protruding portion, the mating structure on the second substrate or wafer.

82. A three axis MEM tunneling/capacitive sensor assembly as claimed in claim 81 wherein the bonding layer is provided by a layer of Au—Si eutectic disposed on the metal contact on said second substrate or wafer and/or by a layer of Au—Si eutectic disposed on first ohmic contact.

83. A three axis MEM tunneling/capacitive sensor assembly as claimed in claim 70 wherein first and second interconnected metal contacts are disposed on said epitaxial layer, the contacts being interconnected by an elongate ribbon of metal, said second interconnected contact being disposed near a distal end of the beam structure, the elongate ribbon being disposed longitudinally on the beam structure and said first interconnected contact forming the mating structure on the first substrate or wafer.

84. A three axis MEM tunneling/capacitive sensor assembly as claimed in claim 83 wherein a protruding portion protrudes from a major surface of said second substrate or wafer, metal contacts are disposed on said second substrate or wafer, at least one of said contacts on the second substrate or wafer defining, in combination with the protruding portion, the mating structure on the second substrate or wafer.

85. A three axis MEM tunneling/capacitive sensor assembly as claimed in claim 84 wherein the eutectic bonding layer is provided by a layer of Au—Si eutectic disposed on the metal contact on said second substrate and/or by a layer of Au—Si eutectic disposed on first interconnected contact.

86. A three axis MEM tunneling/capacitive sensor assembly as claimed in claim 70 wherein a center post in the resonator structure is bonded to the mating structure on the second substrate or wafer.

87. A three axis MEM tunneling/capacitive sensor assembly as claimed in claim 70 wherein an outer frame of the resonator structure is bonded to the mating structure on the second substrate or wafer.

88. A three axis MEM tunneling/capacitive sensor as claimed in claim 70 in which a third wafer is bonded to the top of the sensor in a vacuum to vacuum seal the sensor.

* * * * *